(12) United States Patent
Shinbashi et al.

(10) Patent No.: US 6,704,902 B1
(45) Date of Patent: Mar. 9, 2004

(54) DECODING SYSTEM FOR ERROR CORRECTION CODE

(75) Inventors: Tatsuo Shinbashi, Tokyo (JP); Mitsuaki Suto, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/528,433

(22) Filed: Mar. 17, 2000

Related U.S. Application Data

(63) Continuation-in-part of application No. 09/383,471, filed on Aug. 26, 1999, now abandoned.

(30) Foreign Application Priority Data

Sep. 7, 1998 (JP) .......................................... P10-253074

(51) Int. Cl.$^7$ ............................................. H03M 13/00
(52) U.S. Cl. ...................................... 714/785; 714/704
(58) Field of Search ............................... 714/785, 781, 714/704

(56) References Cited

U.S. PATENT DOCUMENTS

| | | | | |
|---|---|---|---|---|
| 4,642,808 A | * | 2/1987 | Baggen ....................... 742/788 |
| 5,297,153 A | * | 3/1994 | Baggen et al. .............. 714/752 |
| 5,517,509 A | * | 5/1996 | Yoneda ....................... 714/752 |
| 5,537,426 A | * | 7/1996 | Lee ............................. 714/752 |
| 5,563,896 A | * | 10/1996 | Nakaguchi .................. 714/752 |
| 5,642,367 A | * | 6/1997 | Kao ............................. 714/763 |
| 5,715,262 A | * | 2/1998 | Gupta .......................... 714/752 |
| 6,131,178 A | * | 10/2000 | Fujita et al. ................. 714/784 |

* cited by examiner

*Primary Examiner*—Phung M. Chung
(74) *Attorney, Agent, or Firm*—Sonnenschein, Nath & Rosenthal LLP

(57) ABSTRACT

In a decoding system of an error correction code, a mixed correction of, for example, a one-extended Reed-Solomon code at one path is made possible. The number $\epsilon$ of erasures and an erasure position polynomial $E(x)$ are obtained from an erasure flag F including an extended erasure flag $F_-$. A syndrome polynomial $S(x)$ is obtained from a received word R including an extended received symbol $R_-$, a modified syndrome polynomial $Sm(x)$ is obtained from the polynomials $E(x)$ and $S(x)$, and an error evaluator polynomial $\omega(x)$ and an error locator polynomial $\sigma(x)$ are obtained from the $Sm(x)$. An error position i is detected from $\sigma(x)$. An error value ei at a position i is calculated from $\omega(x)$, $\sigma(x)$ and the error position i, an extended error value $e_-$ is calculated from this error value ei and the 0th element $S_0$ of the syndrome S, and further, presumed information Ip is obtained from the received word R, the error position i, the error value ei, and the extended error value $e_-$. Correctable judgement is made by using $\omega(x)$, $\sigma(x)$, $\epsilon$, the number p of parity symbols, and the like, and if correctable, presumed information Ip is outputted.

15 Claims, 20 Drawing Sheets

DECODING APPARATUS OF ONE-EXTENDED REED-SOLOMON CODE

FLOWCHART OF SYNDROME CALCULATION

FLOWCHART OF CALCULATION OF $\omega(x)$, $\sigma(x)$
(ALGORITHM USING EUCLIDEAN MUTUAL DIVISION METHOD)

FLOWCHART OF ERROR POSITION DETECTION

FLOWCHART OF ERROR CORRECTION EXECUTION

FLOWCHART OF DECODING ONE-EXTENDED REED-SOLOMON CODE
(FIRST EMBODIMENT)

FLOWCHART OF CALCULATION OF ω (X), σ (X)
(ALGORITHM USING EUCLIDEAN MUTUAL DIVISION METHOD)

FLOWCHART OF ERROR CORRECTION EXECUTION

FLOWCHART OF SYNDROME CALCULATION

DECODING SYSTEM FOR ERROR CORRECTION CODE

CROSS REFERENCE TO RELATED APPLICATION

This application is a continuation-in-part of application Ser. No. 09/383,471, filed Aug. 26, 1999, now abandoned.

BACKGROUND OF THE INVENTION

1. Field of the Invention

The present invention relates to a decoding system for decoding an error correction code such as an extended Reed-Solomon code extended by one symbol. More particularly, the invention relates to a decoding system which enables a mixed correction of, for example, a one-extended Reed-Solomon code at one path by integration of means for performing normal correction and erasure correction of an extended symbol.

2. Description of the Related Art

First, an error correction system will be described with reference to FIG. 1.

Let us consider a case where the number of added parity symbols is p and information $I=(I_0, I_1, \ldots, I_{k-1})$ of k symbols is transmitted. The information of k symbols is encoded by an encoder (encoding block) so that p parity symbols are added and a code word $C=(C_0, C_1, \ldots, C_{n-1})$ with a length of n=k+p is obtained.

The code word passes through a transmission path with an error and is received as a received word $R=(R_0, R_1, \ldots, R_{n-1})$ including an error. When an i-th error is made ei, Ri=Ci+ei. The received word R is decoded by a decoder (decoding block), so that a presumed code word $Cp=(Cp_0, Cp_1, \ldots, Cp_{n-1})$ is obtained. Presumed information $Ip=(Ip_0, Ip_1, \ldots, Ip_{k-1})$ is obtained from this code word Cp.

A Reed-Solomon code is one of widely-used error correction codes. In the Reed-Solomon code, when a symbol is expressed by m bits, a maximum code length n max is $2^m-1$. For example, when a symbol is expressed by 8 bits, the maximum code length 'n max' becomes 255.

There is also a one-extended Reed-Solomon code in which the code length of the Reed-Solomon code is extended by one symbol, and the maximum code length 'n max' becomes $2^m$. For example, in the case where a symbol is expressed by 8 bits, the maximum code length 'n max' becomes 256. In the one-extended Reed-Solomon code, while the number of parity symbols p is kept as it is, the information symbols can be made larger than the Reed-Solomon code by one symbol, namely, k+1 symbols.

Next, a decoding method of the Reed-Solomon code will be described. There are three decoding methods, that is, a normal correction in which decoding is performed from onlya received word R, an erasure correction in which decoding is performedby using a received word R and an erasure flag $F=(F_0, F_1, \ldots, F_{n-1})$ indicating a position of the received word where an error appears to exist, and a mixed correction where the normal correction and the erasure correction are performed at the same time. Here, with reference to FIGS. 2 to 6, a decoding method of the mixed correction of the most general Reed-Solomon code will be described.

Here, with respect to a primitive polynomial f(x) on a field $GF(2)=\{0, 1\}$, a root of f(x)=0 is made α, and an extension field of GF(2) is formed. At this time, if the degree of the primitive polynomial f(x) is made m, one symbol becomes m bits, and the extension field $GF(2^m)$ is expressed by equation (1).

[Numerical Expression 1]

$$GF(2^m)=\{0, 1, \alpha, \alpha 2, \ldots \alpha^x\}, \text{ where } x=2^m-2 \tag{1}$$

A generating polynomial g(x) of the Reed-Solomon code used here is expressed by equation (2).

[Numerical Expression 2]

$$g(x) = \prod_{i=0}^{p-1}(x-\alpha^i) \tag{2}$$

FIG. 2 shows a flowchart of decoding of the Reed-Solomon code.

First, at step 100, a received word $R=(R_0, R_1, \ldots, R_{n-1})$ and an erasure flag $F=(F_0, F_1, \ldots, F_{n-1})$ are given. The erasure flag F is a flag in which 1 is set for a position in the received word R where it is predicted that an error exists, and 0 is set for other positions where it is predicted that an error does not exist.

Next, at step 101, the number of erasures ε is obtained through equation (3), and an erasure position polynomial E(x) is obtained through equation (4).

[Numerical Expression 3]

$$\epsilon = \#\{i|F_i=1\} \text{ [for } i=0\sim(n-1)] \tag{3}$$

$$E(x)=\Pi_{Fi=1}(1-\alpha^i x) \text{ [for } i=0\sim(n-1)] \tag{4}$$

Next, at step 102, using a parity check matrix H as expressed by equation (5), a syndrome $S=(S_0, S_1, \ldots, S_{p-1})$ is obtained from equation (6). A calculation method of the syndrome S will be described later with reference to FIG. 3. Then a syndrome polynomial S(x) as expressed by equation (7) is obtained.

[Numerical Expression 4]

$$H = \begin{pmatrix} 1 & 1 & 1 & \cdots & 1 \\ 1 & \alpha & \alpha^2 & \cdots & \alpha^{n-1} \\ & & \cdot & & \\ & & \cdot & & \\ & & \cdot & & \\ 1 & \alpha^{p-1} & \alpha^{2(p-1)} & \cdots & \alpha^{(n-1)(p-1)} \end{pmatrix} \tag{5}$$

$${}^tS=H^tR \tag{6}$$

$$S(x)=S_0+S_1 x+S_2 x^2+\ldots+S_{p-1}x^{p-1} \tag{7}$$

Next, at step 103, using the erasure position polynomial E(x) and the syndrome polynomial S(x), a modified syndrome polynomial Sm(x) is obtained as expressed by equation (8).

[Numerical Expression 5]

$$Sm(x)=S(x)E(x) \bmod x^p \tag{8}$$

Next, at step 104, an error evaluator polynomial ω(x) and an error locator polynomial σ(x) are obtained by using the modified syndrome polynomial Sm(x). A calculation method of the error evaluator polynomial ω(x) and the error locator polynomial σ(x) will be described later with reference to FIG. 4.

Next, at step 105, the condition of deg ω(x)<deg σ(x) is judged, and if the condition is false, the procedure proceeds to step 110, outputs an error signal, and is ended, and if true, it proceeds to step 106. Here, deg ω(x) is the degree of the error evaluator polynomial ω(x) and deg σ(x) is the degree of the error locator polynomial σ(x).

At step 106, the condition of equation (9) is judged, and if false, the procedure proceeds to step 110, outputs an error signal, and is ended, and if true, it proceeds to step 107. Incidentally, a bracket of the right side of equation (9) means that a decimal fraction is omitted. The same thing can be said to subsequent equations.

[Numerical Expression 6]

$$deg\sigma(x) \le \left\lfloor \frac{p+\varepsilon}{2} \right\rfloor \qquad (9)$$

At step 107, an error position is detected by using the error locator polynomial σ(x). A calculation method of the error position will be described later with reference to FIG. 5. At step 108, the condition of #roots=deg σ(x) is judged, and if false, the procedure proceeds to step 110, outputs an error signal, and is ended, and if true, it proceeds to step 109. Here, the #roots is the number of error positions detected at step 107.

At step 109, from the error evaluator polynomial ω(x), the error locator polynomial σ(x) obtained at step 104, and the error position i detected at step 107, an error value ei at the position i is calculated. Further, from the received word R, the error position i, and the error value ei, presumed information Ip=(Cp$_0$, Cp$_1$, . . . , Cp$_{k-1}$) is calculated and is outputted. A calculation method of the presumed information Ip will be described later with reference to FIG. 6.

With reference to the flowchart of FIG. 3, a method of calculating the syndrome S from the received word R will be described.

First, at step 120, the received word R=(R$_0$, R$_1$, . . . , R$_{n-1}$) is received. At step 121, the respective elements (S$_0$, S$_1$, . . . , S$_{p-1}$) of the syndrome S are initialized by the element R$_0$ of the received word R. At step 122, a counter I is initialized to 1.

Next, at step, 123, the respective elements of the syndrome S are renewed by equation (10).

[Numerical Expression 7]

$$Sj=Sj+Ri\times\alpha^{ij}[\text{for } j=0 \text{ to } (p-1)] \qquad (10)$$

Next, at step 124, the value of the counter i is increased by 1. At step 125, the condition of i<n is judged, and if true, the procedure returns to step 123 and the syndrome calculation is repeated, and if false, it proceeds to step 126 and outputs the syndrome S=(S$_0$, S$_1$, . . . , S$_{p-1}$).

Using a flowchart of FIG. 4, a method of calculating the error evaluator polynomial ω(x) and the error locator polynomial σ(x) from the modified syndrome polynomial Sm(x) (a method by algorithm using the Euclidean mutual division method) will be described.

First, at step 130, r$_{-1}$(x), r$_0$(x), u$_{-1}$(x), u$_0$(x), v$_{-1}$(x), and v$_0$(x) are initialized as expressed by equation (11).

[Numerical Expression 8]

$$\begin{cases} r_{-1}(x) = x^p \\ r_0(x) = Sm(x) \end{cases} \begin{cases} u_{-1}(x) = 1 \\ u_0(x) = 0 \end{cases} \begin{cases} v_{-1}(x) = 0 \\ v_0(x) = 1 \end{cases} \qquad (11)$$

Next, at step 131, the counter i is initialized to 0. At step 132, the value of the counter i is increased by 1. At step 133, division is performed, so that q$_{i-1}$(x) satisfying equation (12) is found. Here, deg r$_i$(x) is the degree of r$_i$(x), and deg r$_{i-1}$(x) is the degree of r$_{i-1}$(x).

[Numerical Expression 9]

$$r_i(x)=r_{i-2}(x)-q_{i-1}(x)r_{i-1}(x), \text{ deg } r_i(x)<\text{deg } r_{i-1}(x) \qquad (12)$$

Next, at step 134, using q$_{i-1}$(x) found at step 133, u$_i$(x) and v$_i$(x) are renewed as expressed by equation (13).

[Numerical Expression 10]

$$\begin{cases} u_i(x) = u_{i-2}(x) - q_{i-1}(x)u_{i-1}(x) \\ v_i(x) = v_{i-2}(x) - q_{i-1}(x)v_{i-1}(x) \end{cases} \qquad (13)$$

Next, at step 135, the condition (end condition) of equation (14) is judged, and if true, the procedure proceeds to step 136, and if false, it returns to step 132, and division is again performed at step 133. At step 136, as expressed by equation (15), the error evaluator polynomial ω(x) and the error locator polynomial σ(x) are set.

[Numerical Expression 11]

$$deg r_i(x) < \left\lfloor \frac{p+\varepsilon}{2} \right\rfloor \qquad (14)$$

$$\begin{cases} \omega(x) = r_i(x) \\ \sigma(x) = v_i(x) \cdot E(x) \end{cases} \qquad (15)$$

By using a flowchart of FIG. 5, a method of detecting an error position from the error locator polynomial σ(x) will be described.

First, at step 140, the counter i is initialized to 0. At step 141, the condition of σ(α$^{-1}$)=0 is judged, and if true, the position indicated by the counter i is an erroneous position, and the procedure proceeds to step 142, and if false, the position indicated by the counter i is not an erroneous position, and. the procedure proceeds to step 143. At step 142, the value of the counter i expressing the detected error position is stored into memory A, and the procedure proceeds to step 143. At step 143, the value of the counter i is increased by 1.

Next, at step 144, the condition of i<n (end condition) is judged, and if true, the procedure returns to step 141 and repeats the detection of an error position, and if false, it proceeds to step 145. At step 145, the stored contents of the memory A are outputted as the error position.

By using a flowchart of FIG. 6, a method of correcting an error of the received word R from the error evaluator polynomial ω(x), the error locator polynomial σ(x), and the detected error position i will be described.

First, at step 150, the counter i is initialized to 0. Then, at step 151, the condition of i∈A is judged, and if true, the value of the counter i indicates the error position, and the procedure proceeds to step 152, and if false, the value of the counter i is not the error position, and the procedure proceeds to step 154.

At step 152, by using the error evaluator polynomial ω(x), the differential σ'(x) of the error locator polynomial σ(x), and the error position i, an error value ei is calculated as expressed by equation (16), and the procedure proceeds to step 153. At step 153, the i-th element Cpi of a presumed code word Cp is calculated as Ri−ei, and the procedure proceeds to step 155. At step 154, the i-th element Cpi of the presumed code word Cp is made Ri, and the procedure proceeds to step 155.

[Numerical Expression 12]

$$e_i = (-\alpha^i)\frac{\omega(\alpha^{-i})}{\sigma'(\alpha^{-i})} \qquad (16)$$

At step 155, the value of the counter i is increased by 1. At step 156, the condition of i<n (end condition) is judged, and if true, the procedure returns to step 151 and the calculation of an error value is repeated, and if false, it proceeds to step 157. At step 157, the presumed code word $Cp=(Cp_0, Cp_1, \ldots, Cp_{n-1})$ is obtained, and at step 158, the presumed information $Ip=(Cp_0, Cp_1, \ldots, Cp_{k-1})$ is obtained from the presumed code word Cp and is outputted.

FIG. 7 shows a structure of a decoding apparatus 160 for performing the foregoing decoding method of the Reed-Solomon code.

This decoding apparatus 160 includes an input terminal 161 to which the received word (input data) R is inputted, and an input terminal 162 to which the erasure flag F corresponding to the received word R is inputted.

Besides, the decoding apparatus 160 includes a syndrome polynomial calculating circuit 163 (see the step 102 of FIG. 2) for obtaining the syndrome polynomial $S(x)$ from the received word R, an erasure position polynomial calculating circuit 164 (see the step 101 of FIG. 2) for obtaining the erasure position polynomial $E(x)$ from the erasure flag F, and an erasure number calculating circuit 165 (see the step 101 of FIG. 2) for obtaining the number $\epsilon$ of erasures from the erasure flag F.

Besides, the decoding apparatus 160 includes an error polynomial calculating circuit 166 (see the step 104 of FIG. 2) which obtains the modified syndrome polynomial $Sm(x)$ from the syndrome polynomial $S(x)$ and the erasure position polynomial $E(x)$, and obtains the error evaluator polynomial $\omega(x)$ and the error locator polynomial $\sigma(x)$ from this modified syndrome polynomial $Sm(x)$.

Besides, the decoding apparatus 160 includes an error value calculating circuit 167 (see the step 152 of FIG. 6) for obtaining the error value ei of each element Ri of the received word R from the error evaluator polynomial $\omega(x)$ and the error locator polynomial $\sigma(x)$, a received word delay circuit 168 for matching the timing of each element Ri of the received word R with the timing of the error value ei outputted from the error value calculating circuit 167, and a subtracter 169 (see the step 153 of FIG. 6) for subtracting the error value ei from each element Ri of the received word R.

Besides, the decoding apparatus 160 includes a signal selecting circuit 170 for selectively taking out either one of the output Ri−ei of the subtracter 169 and the output Ri of the received word delay circuit 168, an error position judging circuit 171 which not only detects the error position i from the error locator polynomial $\sigma(x)$ and outputs a selection signal SEL corresponding to the error position i, but also judges the condition of #roots=deg $\sigma(x)$ (see the step 108 of FIG. 2), and outputs an error signal ER if false, and an output terminal 172 for extracting the output of the signal selecting circuit 170.

Here, the selection signal SEL outputted from the error position judging circuit 171 is supplied to the signal selecting circuit 170. At the signal selecting circuit 170, the output Ri−ei of the subtracter 169 is taken out at the error position i, and the output Ri of the received word delay circuit 168 is taken out at a position which is not the error position i.

Besides, the decoding apparatus 160 includes an error judging circuit 173 which judges the condition of deg $\omega(x)$<deg $\sigma(x)$ and the condition of equation (9) (see the steps 105 and 106 of FIG. 2), and outputs an error signal ER if false, an OR gate 174 to which the error signal ER outputted from the error position judging circuit 171 and the error signal ER outputted from the error judging circuit 173 are inputted, and an output terminal 175 for extracting the output of the OR gate 174.

Incidentally, the output of the OR gate 174 is supplied to the signal selecting circuit 170, and in the case that the error signal ER is obtained as the output of the OR gate 174, at the signal selecting circuit 170, the output Ri of the received word delay circuit 168 is always taken out irrespective of the state of the selecting signal SEL.

The operation of the decoding apparatus 160 shown in FIG. 7 will be described.

The received word R (input data) inputted to the input terminal 161 is supplied to the syndrome polynomial calculating circuit 163. In this calculating circuit 163, the syndrome S is calculated from the received word R, and the syndrome polynomial $S(x)$ is obtained. On the other hand, the erasure flag F inputted to the input terminal 162 is supplied to the erasure position polynomial calculating circuit 164. In this calculating circuit 164, the erasure position polynomial $E(x)$ is obtained from the erasure flag F. Besides, the erasure flag F inputted to the input terminal 162 is supplied to the erasure number calculating circuit 165. In this calculating circuit 165, the number $\epsilon$ of erasures is obtained from the erasure flag F.

The syndrome polynomial $S(x)$ obtained in the calculating circuit 163 and the erasure position polynomial $E(x)$ obtained in the calculating circuit 164 are supplied to the error polynomial calculating circuit 166. In this calculating circuit 166, the modified syndrome polynomial $Sm(x)$ is obtained from the syndrome polynomial $S(x)$ and the erasure position polynomial $E(x)$, and further, the error evaluator polynomial $\omega(x)$ and the error locator polynomial $\sigma(x)$ are obtained from this modified syndrome polynomial $Sm(x)$.

The error evaluator polynomial $\omega(x)$ and the error locator polynomial $\sigma(x)$ obtained in the calculating circuit 166 are supplied to the error value calculating circuit 167. In this calculating circuit 167, the error value ei of each element Ri of the received word R is sequentially obtained from the error evaluator polynomial $\omega(x)$ and the error locator polynomial $\sigma(x)$. This error value ei is supplied to the subtracter 169, and is subtracted from each element Ri of the received word R outputted from the received word delay circuit 168.

The error locator polynomial $\sigma(x)$ obtained in the calculating circuit 166 is supplied to the error position judging circuit 171. In this error position judging circuit 171, the error position i is detected from the error locator polynomial $\sigma(x)$, and the selection signal SEL corresponding to the error position i is outputted. This selection signal SEL is supplied to the signal selecting circuit 170 as a control signal. In the signal selecting circuit 170, the output Ri−ei of the subtracter 169 is taken out at the error position i, and the output Ri of the received word delay circuit 168 is taken out at a position which is not the error position i.

By this, the presumed code word Cp which has been subjected to error correction is taken out from the signal selecting circuit 170, and this presumed code word Cp is extracted to the output terminal 172 as output data. By removing the parity symbol portion from the presumed code word Cp, the presumed information $Ip=(Cp_0, Cp_1, \ldots, Cp_{k-1})$ is obtained.

Incidentally, in the case where the error signal ER is outputted from the error judging circuit 173 or the error position judging circuit 171, this error signal ER is extracted to the output terminal 175, and this error signal ER is supplied to the signal selecting circuit 170. In the signal selecting circuit 170, irrespective of the state of the selection signal SEL, the output Ri of the received word delay circuit 168 is always taken out. By this, in the state where the error signal ER is extracted to the output terminal 175, the received word R is not subjected to error correction but is outputted as it is to the output terminal 172.

As described above, the normal Reed-Solomon code has been capable of being subjected to a mixed correction at one path. On the other hand, with respect to the one-extended Reed-Solomon code, although a method of mixed correction at two paths has been proposed (Richard E. Blahut, "THEORY AND PRACTICE OF ERROR CONTROL CODES", ISBN: 0-201-10102-5, p. 260—"9.3 DECODING OF EXTENDED REED-SOLOMON CODES"), a method of mixed correction at one path has not been proposed. The mixed correction at two paths for the one-extended Reed-Solomon code has disadvantages that it takes a time to perform decoding, and the scale of hardware becomes large.

SUMMARY OF THE INVENTION

An object of the present invention is therefore to provide a decoding system for an error correction code, which enable a mixed correction at one path for a one-extended Reed-Solomon code.

A decoding method for an error correction code of the present invention comprises the steps of obtaining a syndrome polynomial from input data containing an extended symbol through calculation inclusive of the extended symbol; obtaining an erasure position polynomial from an erasure flag corresponding to the input data; obtaining the number of erasures from the erasure flag corresponding to the input data; obtaining an error locator polynomial and an error evaluator polynomial from the syndrome polynomial and the erasure position polynomial; obtaining an error position from the error locator polynomial and the error evaluator polynomial; obtaining an error value containing the extended symbol from the error locator polynomial and the error evaluator polynomial; obtaining output data by correcting an error of the input data by using the error position and the error value; and performing correctable judgement inclusive of correctable judgement of the extended symbol.

In the present invention, since means for performing a normal correction and an erasure correction of an extended symbol is integrated, a mixed correction at one path for, for example, the one-extended Reed-Solomon code becomes possible.

DETAILED DESCRIPTION OF THE PREFERRED EMBODIMENTS

A first embodiment will be described. This first embodiment is a decoding method of a mixed correction in which a normal correction and an erasure correction are performed at the same time for a one-extended Reed-Solomon code.

Here, with respect to a primitive polynomial f(x) on a field GF(2)={0, 1}, a root of f(x)=0 is made $\alpha$, and an extension field of GF(2) is formed. At this time, when the degree of the primitive polynomial f(x) is made m, one symbol becomes m bits, and the extension field GF($2^m$) is expressed by the foregoing equation (1). A generating polynomial g(x) of the Reed-Solomon code used here is expressed by the foregoing equation (2).

Figure 1:
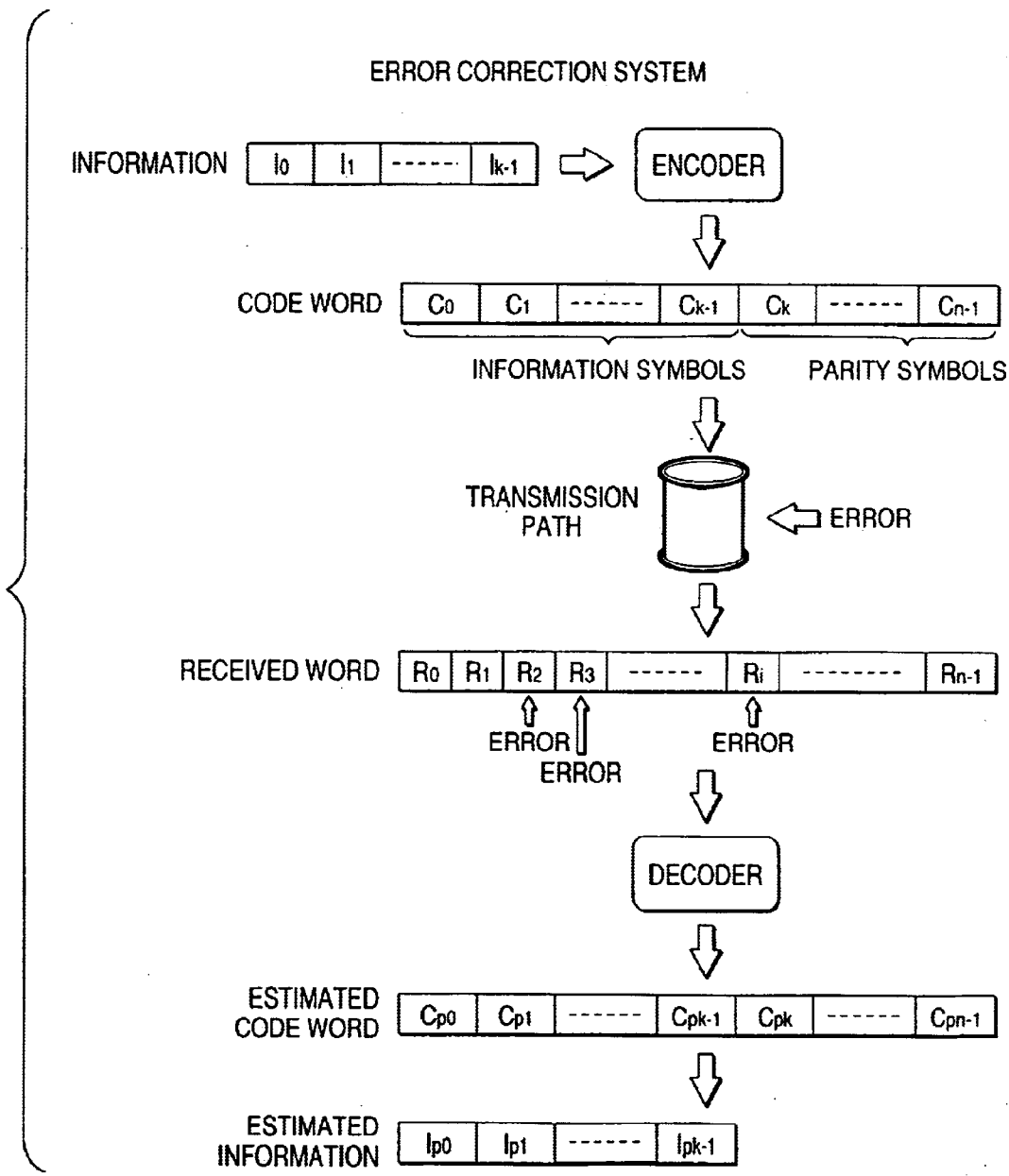
FIG. 1 is a view for explaining an error correction system.
Figure 2:
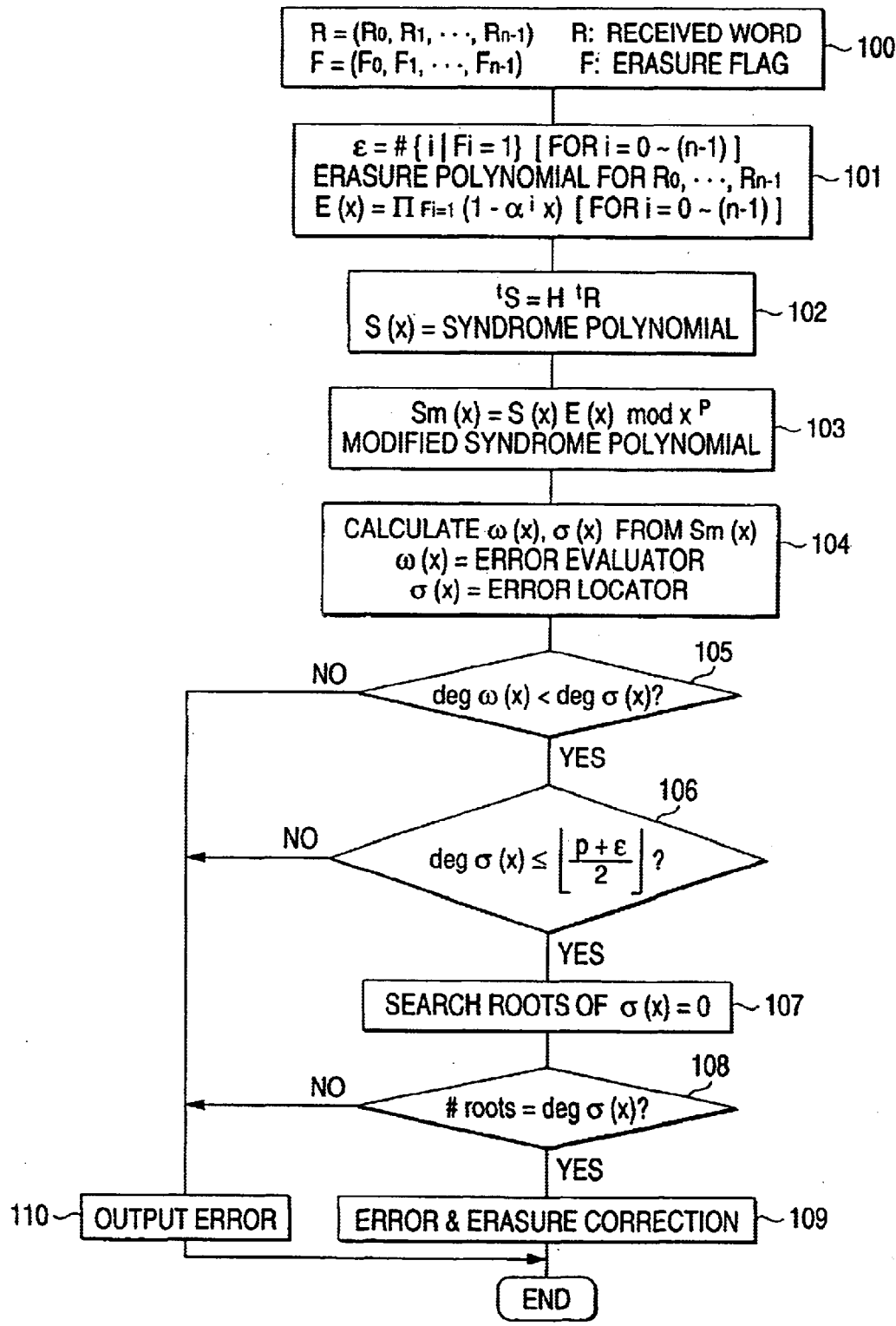
FIG. 2 is a flowchart of conventional decoding of a Reed-Solomon code.
Figure 3:
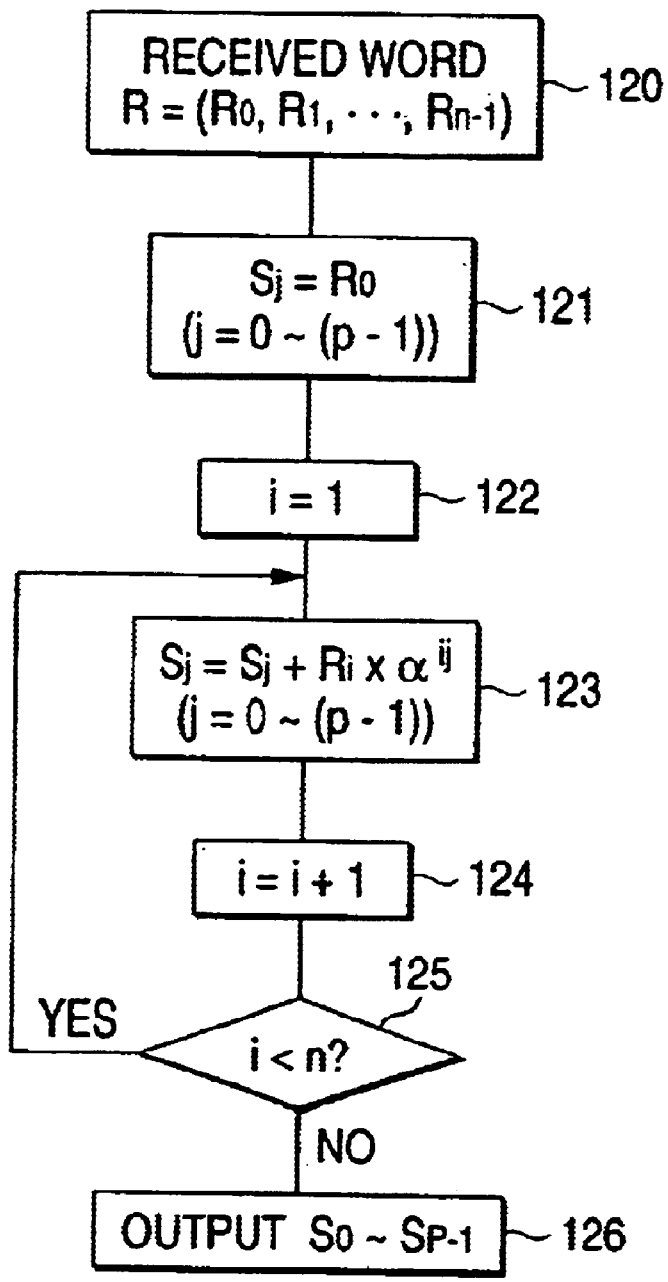
FIG. 3 is a flowchart of syndrome calculation of the Reed-Solomon code.
Figure 4:
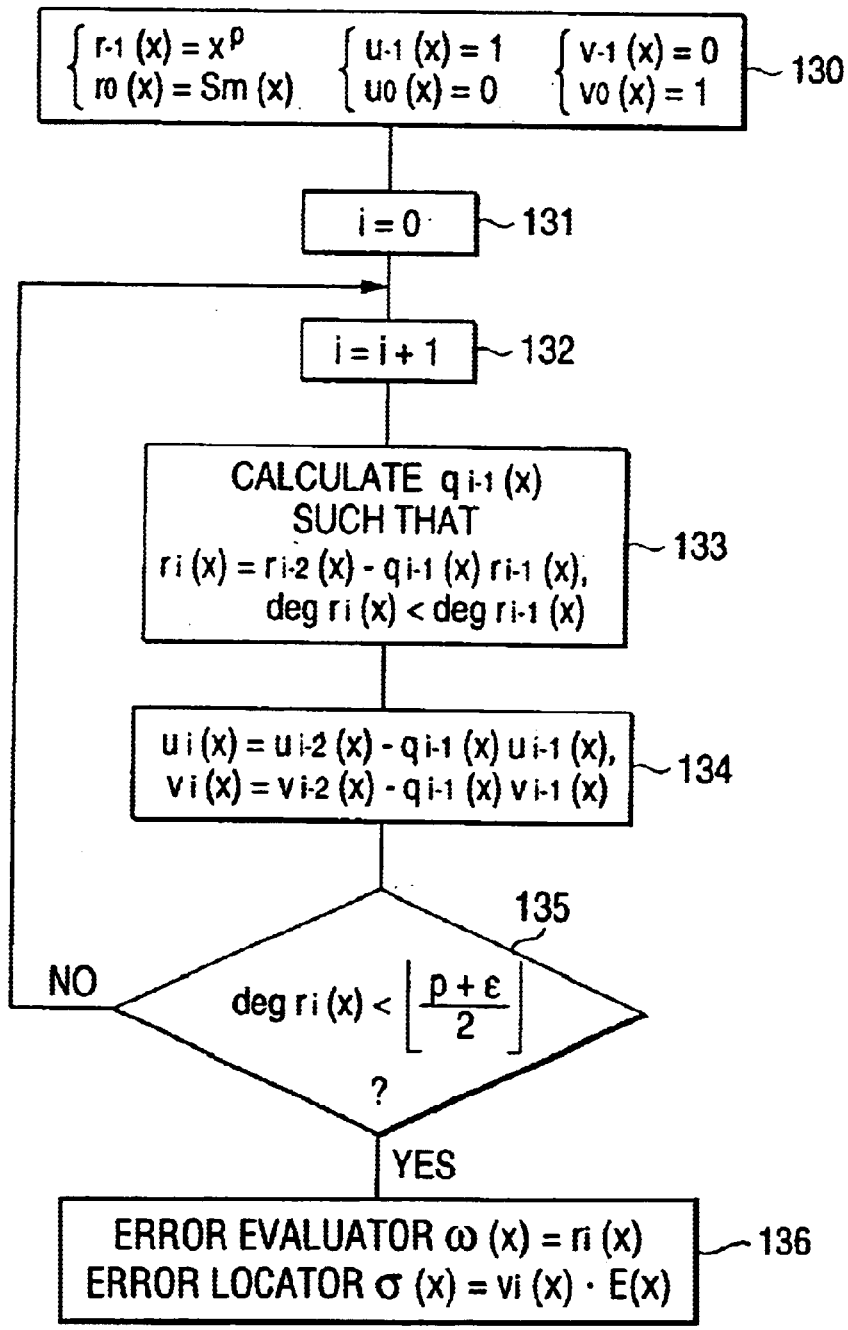
FIG. 4 is a flowchart of calculation (algorithm using the Euclidean mutual division method) of an error evaluator polynomial $\omega(x)$ and an error locator polynomial $\sigma(x)$ of the Reed-Solomon code.
Figure 5:
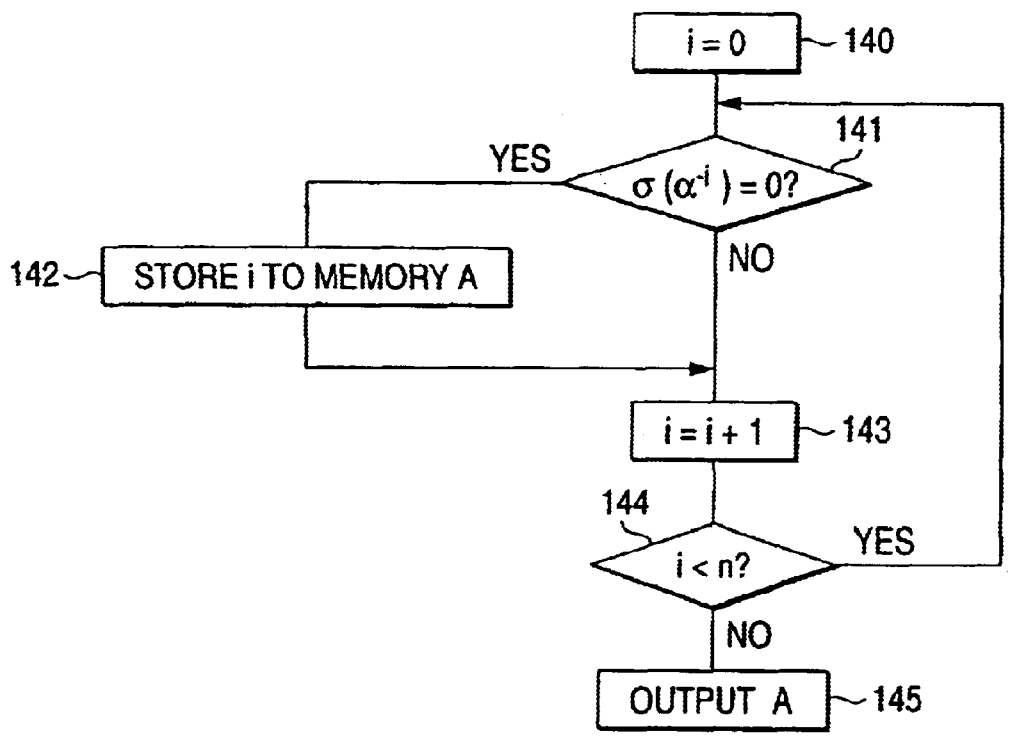
FIG. 5 is a flowchart of error position detection of the Reed-Solomon code.
Figure 6:
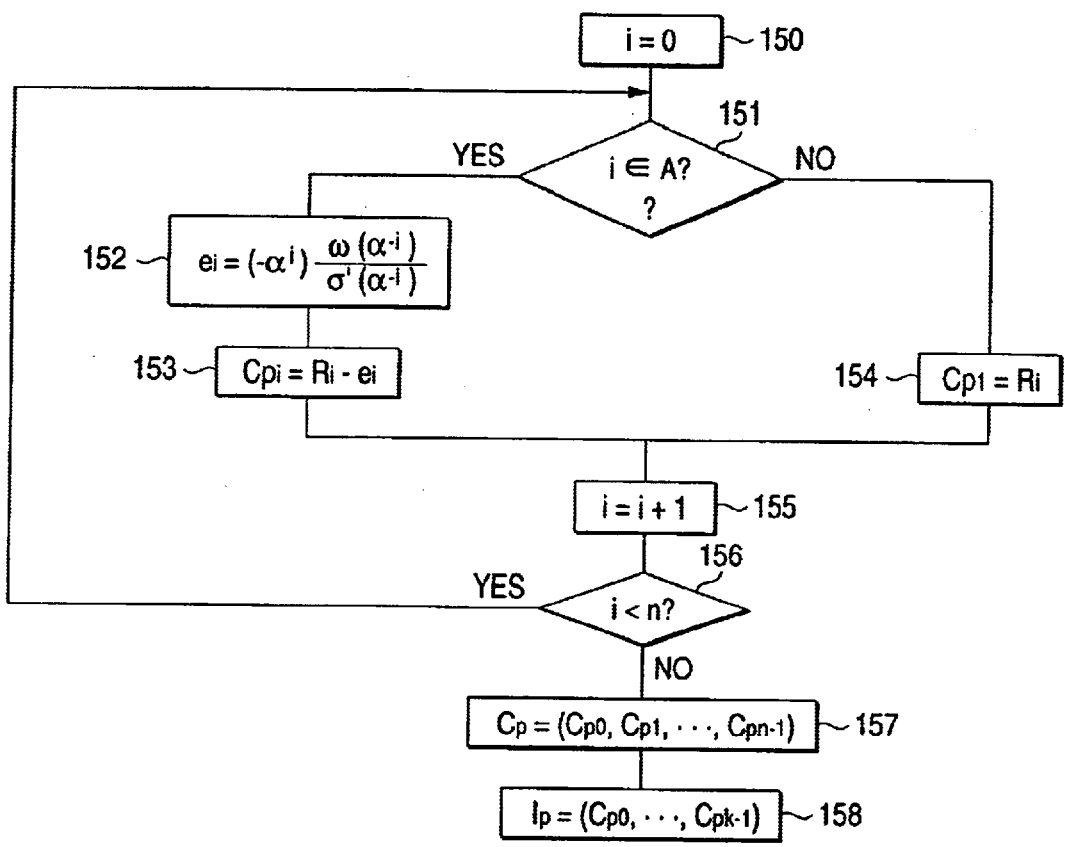
FIG. 6 is a flowchart of error correction execution of the Reed-Solomon code.
Figure 7:
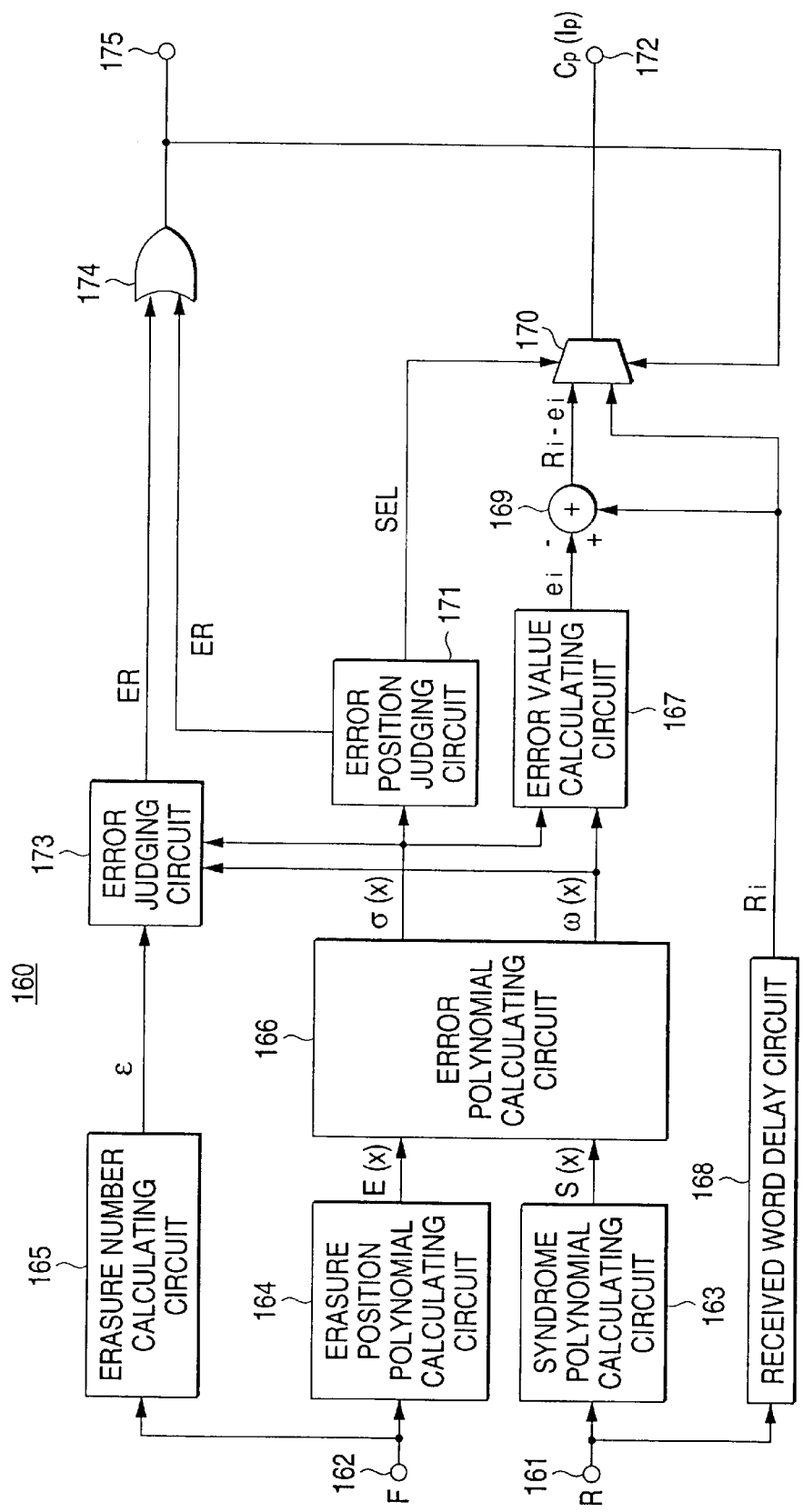
FIG. 7 is a block diagram showing a structural example of a decoding apparatus of the Reed-Solomon code.
Figure 8:
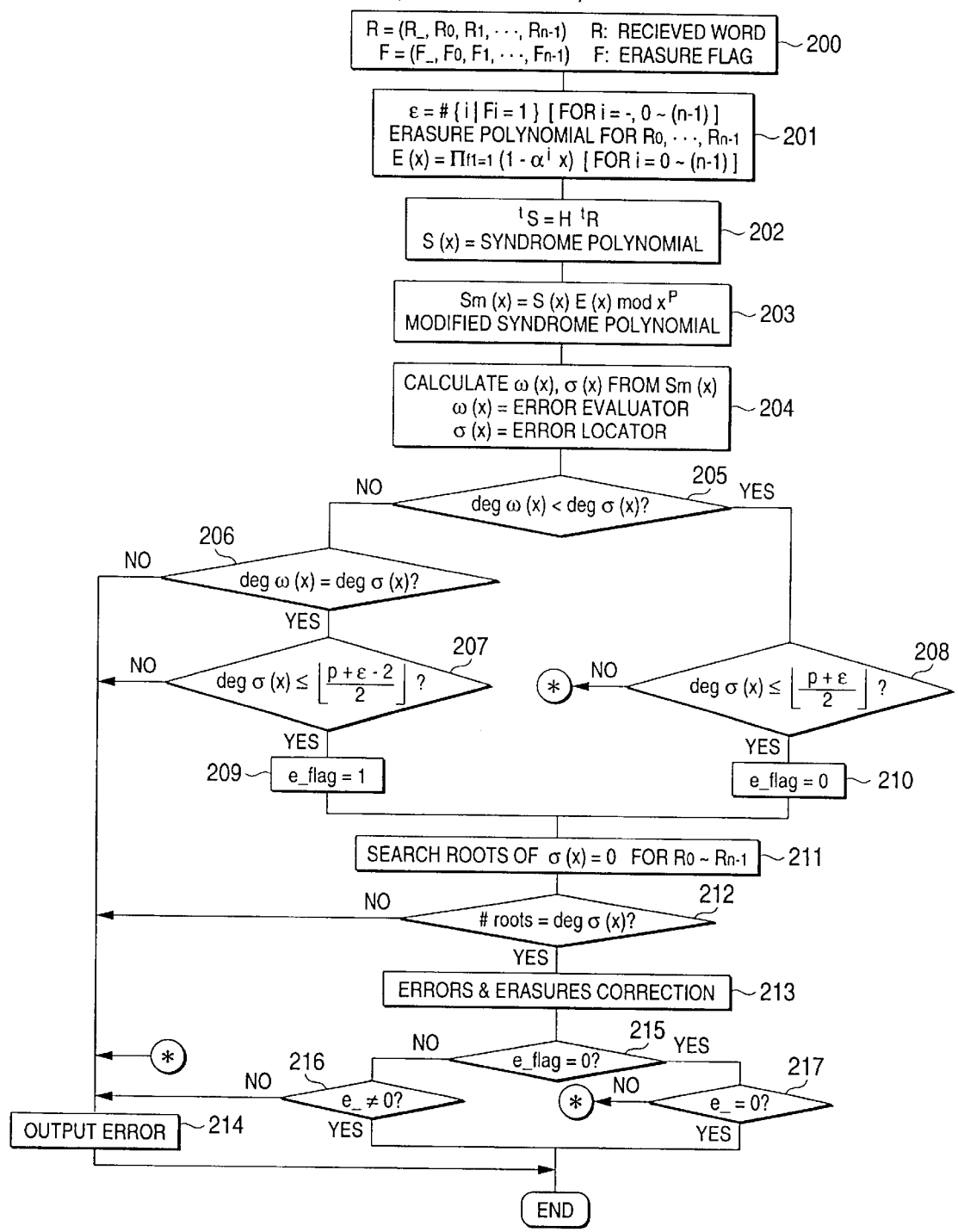
FIG. 8 is a flowchart of decoding of a one-extended Reed-Solomon code according to a first embodiment.

FIG. 8 shows a flowchart of decoding of the one-extended Reed-Solomon code according to the first embodiment.

First, at step 200, a received word R=(R_, $R_0$, $R_1$, . . . , $R_{n-1}$) and an erasure flag F=(F_, $F_0$, $F_1$, . . . , $F_{n-1}$) are given. The erasure flag F is a flag where 1 is set for a position in the received word R where it is predicted that an error exists, and 0 is set for other positions where it is predicted that an error does not exist. The difference from the foregoing conventional decoding method of the Reed-Solomon code is that the extended received symbol R_ and the extended erasure flag F_ have been added. Here, the extended received symbol R_ is obtained by adding all values other than the extended received symbol R_. That is, R_=$R_0$+$R_1$+ . . . , +Rn−1.

Next, at step 201, the number of erasures $\epsilon$ is obtained by equation (17), and an erasure position polynomial E(x) is obtained by the foregoing equation (4). The difference from the foregoing conventional decoding method of the Reed-Solomon code is that the extended erasure flag F_ is added in the calculation of the number $\epsilon$ of erasures.

[Numerical Expression 13]

$$\epsilon = \#\{i | Fi=1\} \text{ [for } i=-, 0 \text{ to } (n-1)] \tag{17}$$

Next, at step 202, using a parity check matrix H as expressed by equation 18, a syndrome S=($S_0$, $S_1$, . . . , $S_{p-1}$)

is obtained from the foregoing equation (6). A calculation method of the syndrome S will be described later with reference to FIG. 9. Then a syndrome polynomial S(x) as expressed by the foregoing equation (7) is obtained.
[Numerical Expression 14]

$$H = \begin{pmatrix} -1 & 1 & 1 & 1 & \cdots & 1 \\ 0 & 1 & \alpha & \alpha^2 & \cdots & \alpha^{n-1} \\ & & & \cdot & & \\ & & & \cdot & & \\ & & & \cdot & & \\ 0 & 1 & \alpha^{p-1} & \alpha^{2(p-1)} & \cdots & \alpha^{(n-1)(p-1)} \end{pmatrix} \quad (18)$$

Next, at step 203, using the erasure position polynomial E(x) and the syndrome polynomial S(x), a modified syndrome polynomial Sm(x) is obtained as expressed by the foregoing equation (8).

Next, at step 204, an error evaluator polynomial ω(x) and an error locator polynomial σ(x) are obtained by using the modified syndrome polynomial Sm(x). A calculation method of the error evaluator polynomial ω(x) and the error locator polynomial σ(x) will be described later with reference to FIG. 10.

Next, at step 205, the condition of deg ω(x)<deg σ(x) is judged, and if the condition is false, the procedure proceeds to step 206, and if the condition is true, the procedure proceeds to step 208. Here, deg ω(x) is the degree of the error evaluator polynomial ω(x) and deg σ(x) is the degree of the error locator polynomial σ(x). At step 206, the condition of deg ω(x)=deg σ(x) is judged, and if false, the procedure proceeds to step 214, outputs an error signal, and is ended, and if true, it proceeds to step 207.

At step 207, the condition of equation (19) is judged, and if false, the procedure proceeds to step 214, outputs an error signal, and is ended, and if true, it proceeds to step 209. At step 209, since it has been found from judgement results of the steps 205 and 206 that an error exists at the extended symbol position, an extended error flag e_flag is set 1, and then, the procedure proceeds to step 211.
[Numerical Expression 15]

$$deg\sigma(x) \leq \left\lfloor \frac{p+\varepsilon-2}{2} \right\rfloor \quad (19)$$

At step 208, the condition of the foregoing equation (9) is judged, and if false, the procedure proceeds to step 214, outputs an error signal, and is ended, and if true, it proceeds to step 210. At step 210, since it has been found from the judgement result of the step 205 that an error does not exist in the extended symbol position, the extended error flag e_flag is set 0, and then, the procedure proceeds to step 211.

At step 211, the error locator polynomial σ(x) is used to detect an error position. At this time, detection of an error position for R_ is not performed. A calculation method of an error position will be described later with reference to FIG. 11. At step 212, the condition of #roots=deg σ(x) is judged, and if false, the procedure proceeds to step 214, outputs an error signal, and is ended, and if true, it proceeds to step 213. Here, #roots is the number of error positions detected at step 211.

At step 213, an, error value ei at a position i is calculated from the error evaluator polynomial ω(x) and the error locator polynomial σ(x) obtained at step 204 and the error position i detected at step 211, and further, an extended error value e_ is calculated by using this error value ei and the 0th element $S_0$ of the syndrome S obtained at step 202, and still further, presumed information Ip=($Cp_-$, $Cp_0$, $Cp_1$, . . . , $Cp_{k-1}$) is calculated from the received word R, the error position i, the error value ei, and the extended error value e_. A calculation method of the presumed information Ip will be described later with reference to FIG. 12.

Next, at step 215, the condition of e_flag=0 is judged, and if false, the procedure proceeds to step 216, and if true, it proceeds to step 217. At step 216, the condition of e_≠0 is judged, and if false, the procedure proceeds to step 214, outputs an error signal, and is ended, and if true, the presumed information Ip is outputted and the procedure is ended. On the other hand, at step 217, the condition of e_=0 is judged, and if false, the procedure proceeds to step 214, outputs an error signal, and is ended, and if true, the presumed information Ip is outputted and the procedure is ended.

Figure 9:
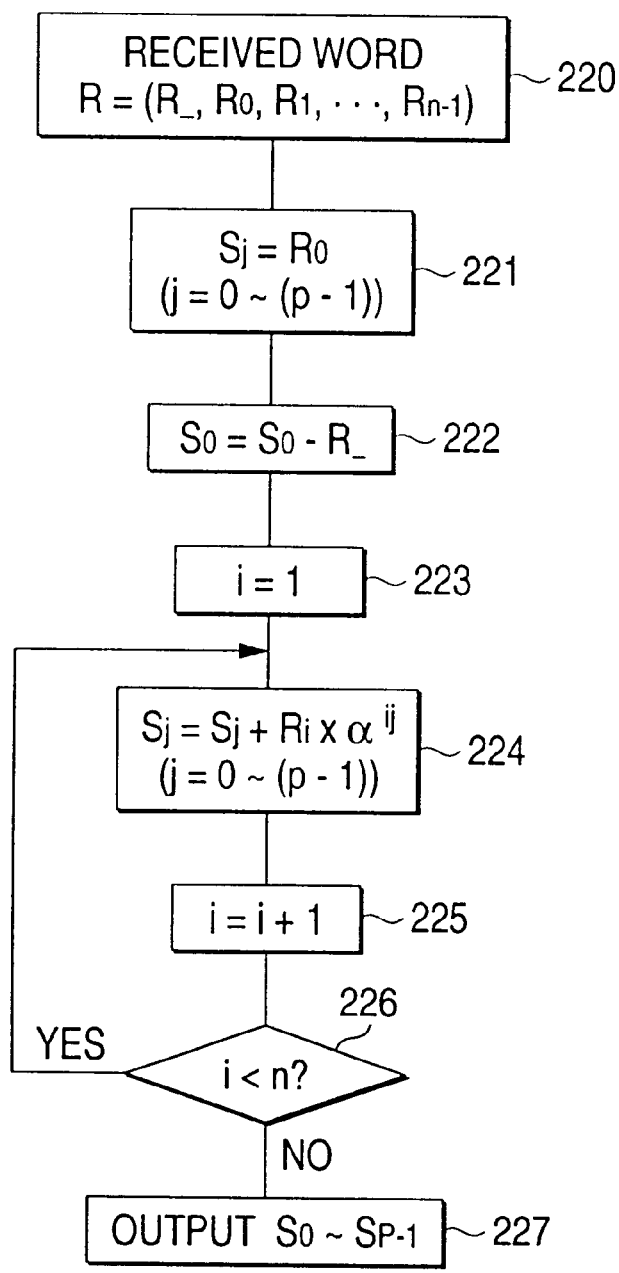
FIG. 9 is a flowchart of syndrome calculation of the one-extended Reed-Solomon code.

A method of calculating the syndrome S from the received word R will be described with reference to the flowchart of FIG. 9.

First, at step 220, the received word R=(R_, $R_0$, $R_1$, . . . , $R_{n-1}$) is received. At step 221, the respective elements ($S_0$, $S_1$, . . . , $S_{p-1}$) of the syndrome S are initialized by the element $R_0$ of the received word R.

Next, at step 222, the first element R_ of the received word R is subtracted from the 0th element $S_0$ of the syndrome S, and the subtraction result is made $S_0$. At step 223, the counter i is initialized to 1. At step 224, the respective elements of the syndrome S are renewed by the foregoing equation (10).

Next, at step 225, the value of the counter i is increased by 1. At step 226, the condition of i<n is judged, and if true, the procedure returns to step 224 and the syndrome calculation is repeated, and if false, it proceeds to step 227 and outputs the syndrome S=($S_0$, $S_1$, . . . , $S_{p-1}$).

A method (method by algorithm usingthe Euclidean mutual division method) of calculating the error evaluator polynomial ω(x) and the error locator polynomial σ(x) from the modified syndrome polynomial Sm(x) will be described with reference to the flowchart of FIG. 10.

First, at step 230, $r_{-1}(x)$, $r_0(x)$, $u_{-1}(x)$, $u_0(x)$, $v_{-1}(x)$, and $v_0(x)$ are initialized as expressed by the foregoing equation (11). At step 231, the counter i is initialized to 0. At step 232, the value of the counter i is increased by 1. Then, at step 233, division is performed to find $q_{i-1}(x)$ satisfying the foregoing equation (12). Here, deg $r_i(x)$ is the degree of $r_i(x)$, and deg $r_{i-1}(x)$ is the degree of $r_{i-1}(x)$.

Next, at step 234, using $q_{i-1}(x)$ found at step 233, ui(x) and vi(x) are renewed as expressed by the foregoing equation (13).

Next, at step 235, the condition (end condition) of the foregoing equation (14) is judged, and if true, the procedure proceeds to step 236, and if false, it returns to step 232, and division is again performed at step 233. At step 236, as expressed by the foregoing equation (15), the error evaluator polynomial ω(x) and the error locator polynomial σ(x) are set.

Figure 11:
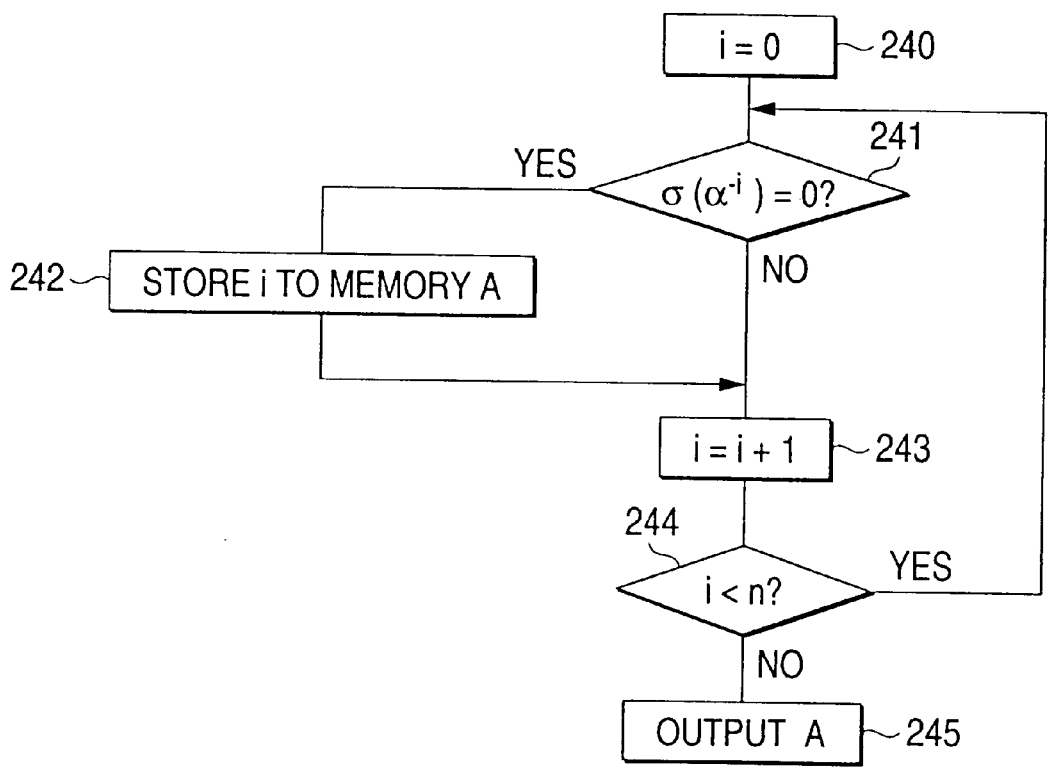
FIG. 11 is a flowchart of error position detection of the one-extended Reed-Solomon code.

A method of detecting the error position from the error locator polynomial σ(x) will be described with reference to the flowchart of FIG. 11.

First, at step 240, the counter i is initialized to 0. At step 241, the condition of σ($\alpha^{-i}$)=0 is judged, and if true, the position indicated by the counter i is an error position, and the procedure proceeds to step 242, and if false, the position indicated by the counter i is not an error position, and the procedure proceeds to step 243. At step 242, the value of the counter i indicating the detected error position is stored to a memory A, and then, the procedure proceeds to step 243. At step 243, the value of the counter i is increased by 1.

Next, at step 244, the condition (end condition) of i<n is judged, and if true, the procedure returns to step 241 and the detection of error position is repeated, and if false, the procedure proceeds to step 245. At step 245, the stored contents of the memory A are outputted as the error position.

A method of performing error correction of the received word R from the error evaluator polynomial $\omega(x)$, the error locator polynomial $\sigma(x)$, and the detected error position i will be described with reference to the flowchart of FIG. 12.

First, at step 250, a variable w is initialized by the 0th element $S_0$ of the syndrome S. The variable w is used to calculate the extended error value $e_-$ as expressed by equation (20).

[Numerical Expression 16]

$$e_- = S_0 - \sum_{i=0}^{n-1} ei \quad (20)$$

Next, at step 251, the counter i is initialized to 0. At step 252, the condition of i∈A is judged, and if true, the value of the counter i expresses an error position, and the procedure proceeds to step 253, and if false, the value of the counter i is not an error position, and the procedure proceeds to step 256.

At step 253, using the error evaluator polynomial $\omega(x)$, the differential of the error locator polynomial $\sigma(x)$, $\sigma'(x)$ and the error position i, the error value ei is calculated as expressed by the foregoing equation (16), and the procedure proceeds to step 254. At step 254, the i-th element Cpi of the presumed code word Cp is made 'Ri−ei' to make calculation, and the procedure proceeds to step 255. At step 255, the variable w.is renewed as 'w=w−ei', and the procedure proceeds to step 257. At step 256, the i-th element Cpi of the presumed code word Cp is made Ri and the procedure proceeds to step 257.

At step 257, the value of the counter i is increased by 1. At step 258, the condition (end condition) of i<n is judged, and if true, the procedure returns to step 252 and the calculation of error value is repeated, and if false, the procedure proceeds to step 259. At step 259, the value of the variable w is substituted for the extended error value $e_-$.

Next, at step 260, a presumed extended code symbol $Cp_-$ is set as $Cp_-=R_-−e_-$. At step 261, the presumed code word $Cp=(Cp_-, Cp_0, \ldots Cp_{n-1})$ is obtained, and further, at step 262, the presumed information $Ip=(Cp_-, Cp_0, Cp_1, \ldots, Cp_{k-1})$ is obtained from the presumed code word Cp.

Figure 13:
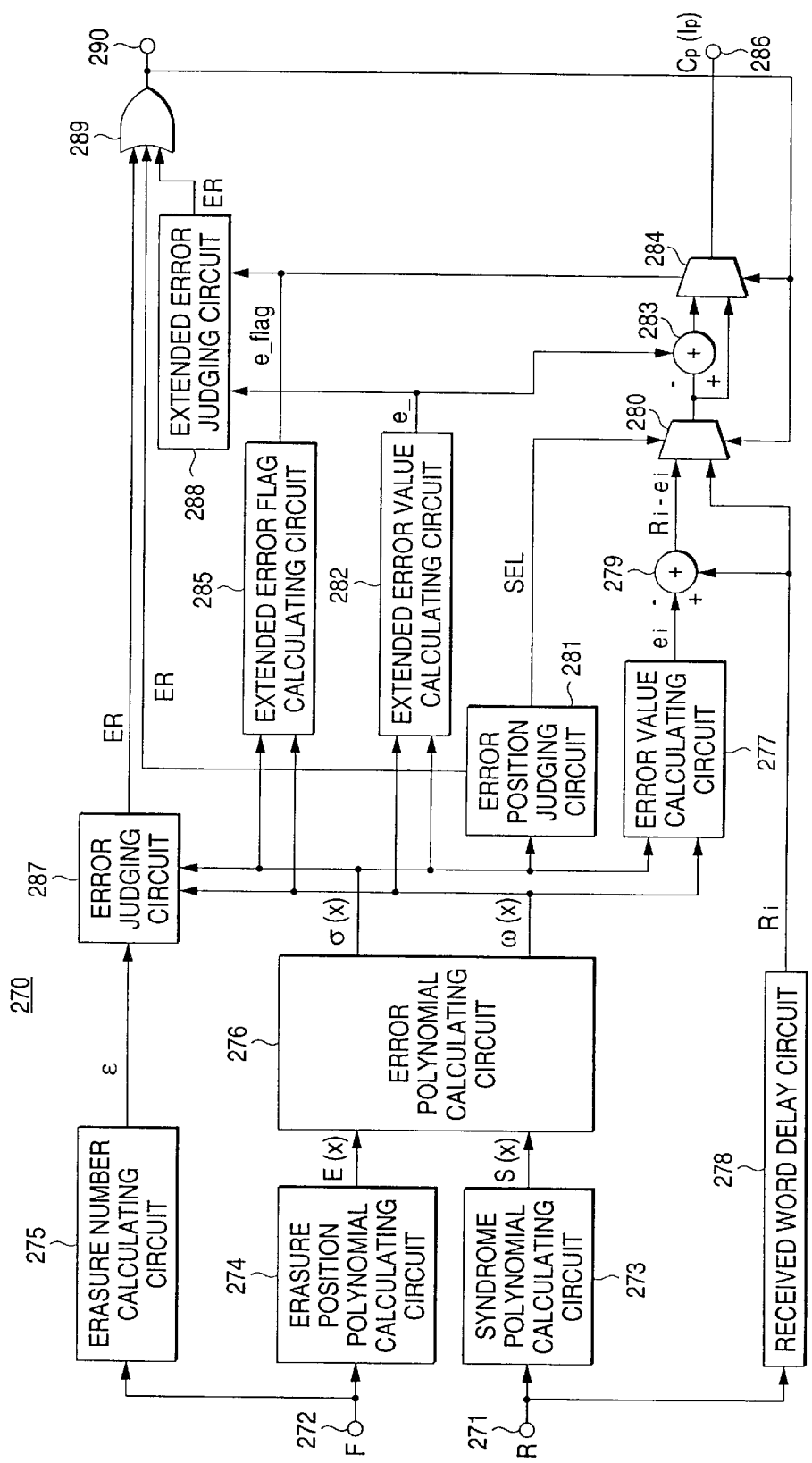
FIG. 13 is a block diagram showing a structural example of a decoding apparatus of the one-extended Reed-Solomon code.

FIG. 13 shows a structure of a decoding apparatus 270 which executes the decoding method of the one-extended Reed-Solomon code shown in the flowchart of FIG. 8.

This decoding apparatus 270 includesan input terminal 271 to which the received word (input data) R is inputted, and an input terminal 272 to which the erasure flag F corresponding to the received word R is inputted.

Besides, the decoding apparatus 270 includes a syndrome polynomial calculating, circuit 273 (see the step 202 of FIG. 8) for obtaining the syndrome polynomial S(x) from the received word R, an erasure position polynomial calculating circuit 274 (see the step 201 of FIG. 8) for obtaining the erasure position polynomial E(x) from the erasure flag F, and an erasure number calculating circuit 275 (see the step 201 of FIG. 8) for obtaining the number $\epsilon$ of erasures from the erasure flag F.

Besides, the decoding apparatus 270 includes an error polynomial calculating circuit 276 (see the step 204 of FIG. 8) which obtains the modified syndrome polynomial Sm(x) from the syndrome polynomial S(x) and the erasure position polynomial E(x), and obtains the error evaluator polynomial $\omega(x)$ and the error locator polynomial $\sigma(x)$ from this modified syndrome polynomial Sm(x).

Besides, the decoding apparatus 270 includes an error value calculating circuit 277 (see the step 253 of FIG. 12) for obtaining an error value ei of each element Ri of the received word R from the error evaluator polynomial $\omega(x)$ and the error locator polynomial $\sigma(x)$, a received word delay circuit 278 for matching the timing of each element Ri of the received word R with the timing of the error value ei outputted from the error value calculating circuit 277, and a subtracter 279 (see the step 254 of FIG. 12) for subtracting the error value ei from each element Ri of the received word R.

Besides, the decoding apparatus 270 includes a signal selecting circuit 280 for selectively taking out either one of the output Ri−ei of the subtracter 279 and the output Ri of the received word delay circuit 278, and an error position judging circuit 281 which detects an error position i from the error locator polynomial $\sigma(x)$, and outputs a selection signal SEL corresponding to the error position i, and further, judges the condition of #roots=deg $\sigma(x)$ (see the step 212 of FIG. 8), and outputs an error signal ER if the condition is false. Here, the selection signal SEL outputted from the error position judging circuit 281 is supplied to the signal selecting circuit 280. At the signal selecting circuit 280, the output Ri−ei of the subtracter 279 is taken out at the error position i, and the output Ri of the received word delay circuit 278 is taken out at a position which is not the error position i.

Besides, the decoding apparatus 270 includes an extended error value calculating circuit 282 (see the step 259 of FIG. 12) for obtaining an extended error value $e_-$ from the error evaluator polynomial $\omega(x)$ and the error locator polynomial $\sigma(x)$, a subtracter 283 (see the step 260 of FIG. 12) for subtracting the extended error value $e_-$ from the output of the signal selecting circuit 280, and a signal selecting circuit 284 for selectively taking out either one of the output of the subtracter 283 and the output of the signal selecting circuit 280.

Besides, the decoding apparatus 270 includes an extended error flag calculating circuit 285 (see the steps 209 and 210 of FIG. 8) which judges from the error evaluator polynomial $\omega(x)$ and the error locator polynomial $\sigma(x)$ whether or not an error exists at an extended symbol position, and sets an extended error flag e_flag, and an output terminal 286 for extracting the output of the signal selecting circuit 284. Here, when judgement is made such that there is an error at the extended symbol position, e_flag=1, and when judgement is made such that there is no error at the extended symbol position, e_flag=0. The extended error flag e_flag outputtedfrom this calculating circuit 285 is supplied to the signal selecting circuit 284.

At the signal selecting circuit 284, when the extended received symbol $R_-$ is outputted from the signal selecting circuit 280, the output $R_-−e_-$ of the subtracter 283 is taken out as the presumed extended symbol $Cp_-$ when e_flag=1, and the output $R_-$ of the signal selecting circuit 280 is taken out as the presumed extended symbol $Cp_-$ when e_flag=0. Besides, at the signal selecting circuit 284, when a symbol other than the extended received symbol $R_-$ is outputted from the signal selecting circuit 280, only the output of the signal selecting circuit 280 is taken out.

Besides, the decoding apparatus 270 includes an error judging circuit 287 which judges the condition of deg $\omega(x)$=deg $\sigma(x)$ and the condition of the equation (19) if deg ω(x)<deg σ(x) is false, judges the condition of the equation (9) if deg ω(x)<deg σ(x) is true (see the steps 205 to 208 of FIG. 8), and outputs the error signal ER if false, and an extended error judging circuit 288 which judges the condition of e_≠0 when e_flag =0 is false, judges the condition of e_=0 if e_flag=0 is true (see the steps 215 to 217 of FIG. 8), and outputs the error signal ER if false.

Besides, the decoding apparatus 270 includes an OR gate 289 to which the error signal ER outputted from the error position judging circuit 281, the error signal ER outputted from the error judging circuit 287, and the error signal ER outputted from the extended error judging circuit 288 are inputted, and an output terminal 290 for extracting the output of the OR gate 289.

The output of the OR gate 289 is supplied to the signal selecting circuits 280 and 284, and in the case where the error signal ER is obtained as the output of the OR gate 289, the output Ri of the received word delay circuit 278 is always taken out in the signal selecting circuit 280 irrespective of the state of the selection signal SEL, and the output of the signal selecting circuit 280 is always taken out in the signal selecting circuit 284 irrespective of the state of the extended error flag e_flag.

The operation of the decoding apparatus 270 shown in FIG. 13 will be described.

The received word (input data) R inputted to the input terminal 271 is supplied to the syndrome polynomial calculating circuit 273. In this calculating circuit 273, the syndrome S is calculated from the received word R, and the syndrome polynomial S(x) is obtained. On the other hand, the erasure flag F inputted to the input terminal 272 is supplied to the erasure position polynomial calculating circuit 274. In this calculating circuit 274, the erasure position polynomial E(x) is obtained from the erasure flag F. The erasure flag F inputted to the input terminal 272 is supplied to the erasure number calculating circuit 275. In this calculating circuit 275, the number ε of erasures is obtained from the erasure flag F.

The syndrome polynomial S(x) obtained in the calculating circuit 273 and the erasure position polynomial E(x) obtained in the calculating circuit 274 are supplied to the error polynomial calculating circuit 276. In this calculating circuit 276, the modified syndrome polynomial Sm(x) is obtained from the syndrome polynomial S(x) and the erasure position polynomial E(x), and further, the error evaluator polynomial ω(x) and the error locator polynomial σ(x) are obtained from this modified syndrome polynomial Sm(x).

The error evaluator polynomial ω(x) and the error locator polynomial σ(x) obtained in the calculating circuit 276 are supplied to the error value calculating circuit 277. In this calculating circuit 277, the error value ei of each element Ri of the received word R is sequentially obtained from the error evaluator polynomial ω(x) and the error locator polynomial σ(x). This error value ei is supplied to the subtracter 279, and is subtracted from each element Ri of the received word R outputted from the received word delay circuit 278.

The error locator polynomial σ(x) obtained in the calculating circuit 276 is supplied to the error position judging circuit 281. In this error position judging circuit 281, the error position i is detected from the error locator polynomial σ(x), and the selection signal. SEL corresponding to the error position i is outputted. This selection signal SEL is supplied to the signal selecting circuit 280 as a control signal. In the signal selecting circuit 280, the output Ri–ei of the subtracter 279 is taken out as the element Cpi of the presumed code word Cp at the error position i, and the output Ri of the received word delay circuit 278 is taken out as the element Cpi of the presumed code word Cp at a position which is not the error position i.

The error evaluator polynomial ω(x) and the error locator polynomial σ(x) obtained in the calculating circuit 276 are supplied to the extended error value calculating circuit 282. In this calculating circuit 282, the error value of the extended received symbol R_, that is, the extended error value e_ is obtained from the error evaluator polynomial ω(x) and the error locator polynomial σ(x). This extended error value e– is supplied to the subtracter 283, and is subtracted from the output of the signal selecting circuit 280.

The error evaluator polynomial ω(x) and the error locator polynomial σ(x) obtained in the calculating circuit 276 are supplied to the extended error flag calculating circuit 285. In this calculating circuit 285, it is judged from the error evaluator polynomial ω(x) and the error locator polynomial σ(x) whether or not, an error exists at the extended symbol position, and when it is judged that there is an error at the extended symbol position, e_flag=1 is set, and when it is judged that there is no error at the extended symbol position, e_flag=0 is set.

This extended error flag e_flag is supplied as a control signal to the signal selecting circuit 284. In the signal selecting circuit 284, when the extended received symbol R_ is outputted from the signal selecting circuit 280, the output R_–e_ of the subtracter 283 is taken out as the presumed extended symbol Cp when e_flag=1, and the output R_ of the signal selecting circuit 280 is taken out as the presumed extended symbol Cp_ when e_flag=0. In the signal selecting circuit 284, when a symbol other than the extended received symbol R_ is outputted from the signal selecting circuit 280, only the output of the signal selecting circuit 280 is taken out.

By this, the presumed code word Cp (including the presumed extended symbol Cp_) subjected to error correction is taken out from the signal selecting circuit 284, and this presumed code word Cp is extracted to the output terminal 286 as output data. By removing the parity symbol portion from the presumed code word Cp, presumed information $Ip=(Cp_-, Cp_0, Cp_1, \ldots, Cp_{k-1})$ is In the case where the error signal ER is outputted from the error position judging circuit 281, the error judging circuit 287, or the extended error judging circuit 288, this error signal ER is extracted to the output terminal 290, and this error signal ER is supplied to the signal selecting circuits 280 and 284. In the signal selecting circuit 280, the output Ri of the received word delay circuit 278 is always taken out irrespective of the state of the selection signal SEL. In the signal selecting circuit 284, the output of the signal selecting circuit 280 is always taken out irrespective of the state of the extended error flag e_flag. By this, in the state where the error signal ER is extracted to the output terminal 290, the received word R is not subjected to error correction, but is outputted to the output terminal 286 as it is.

As described above, in the first embodiment, the mixed correction at one path for the one-extended Reed-Solomon code becomes possible. Thus, this embodiment has such effects that it becomes possible to perform the mixed correction for the one-extended Reed-Solomon code in a short time, and the scale of hardware can be made small.

Figure 14:
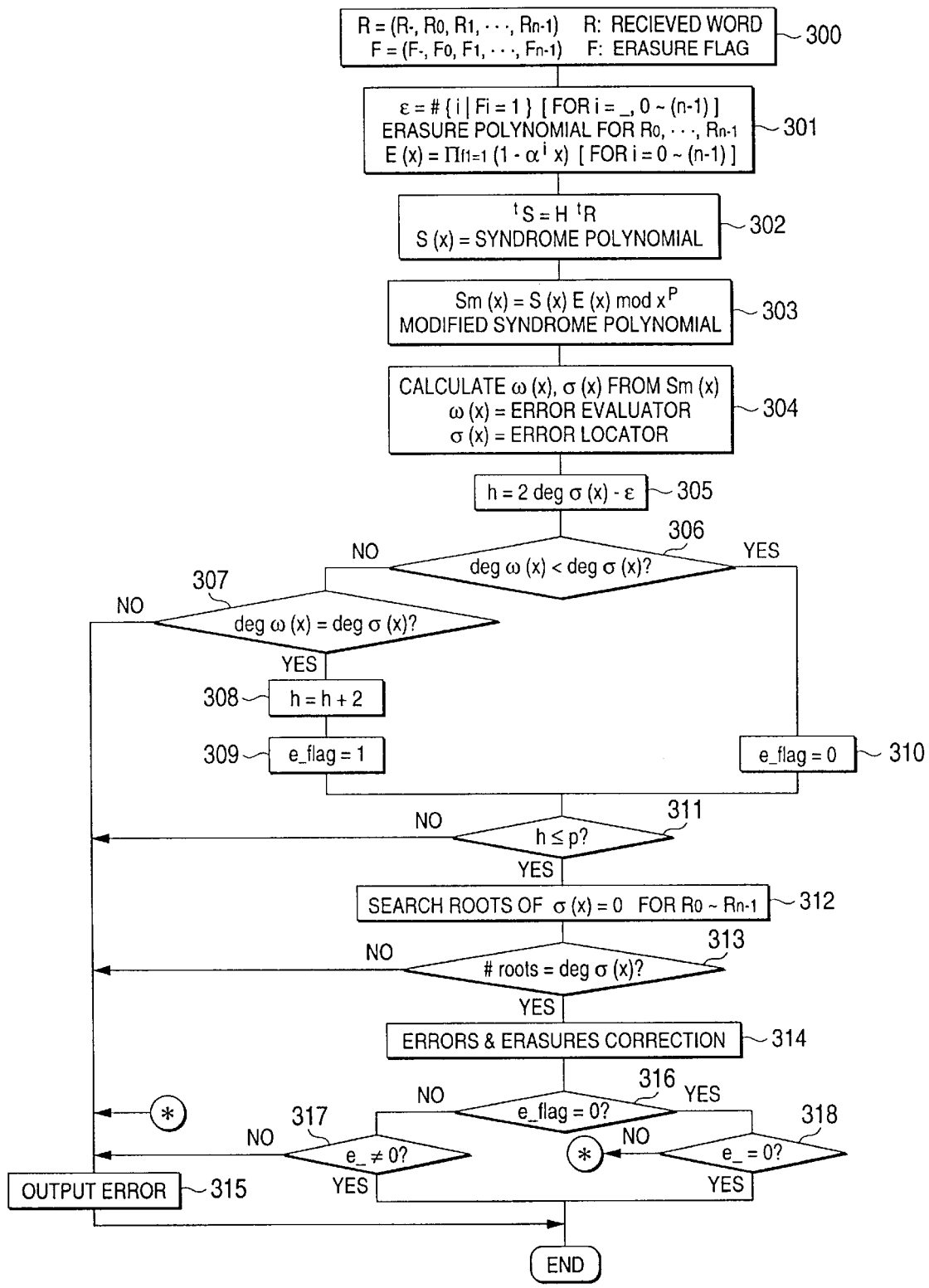
FIG. 14 is a flowchart of decoding of the one-extended Reed-Solomon code according to a second embodiment.

Next, a second embodiment will be described. This second embodiment also relates to a decoding method of a mixed correction in which a normal correction and an erasure correction are performed at the same time for the one-extended Reed-Solomon code. FIG. 14 shows a flowchart of decoding of the one-extended Reed-Solomon code in the second embodiment.

First, processing at steps 300 to 304 is performed. At the steps 300 to 304, similar processing to the steps 200 to 204 of FIG. 8 is performed.

Next, at step 305, a correctable judgement number h is set as h=2 deg σ(x)–ε. Although the correctable judgement number h is used at step 311 described later, it finally becomes one as expressed by equation (21).

[Numerical Expression 17]

$$h = \begin{cases} 2\deg\sigma(x) - \varepsilon & (\text{if } \deg\omega(x) < \deg\sigma(x)) \\ 2\deg\sigma(x) - \varepsilon + 2 & (\text{if } \deg\omega(x) = \deg\sigma(x)) \end{cases} \quad (21)$$

Next, at step 306, the condition of deg ω(x)<deg σ(x) is judged, and if false, the procedure proceeds to step 307, and if true, it proceeds to step 310. At step 307, the condition of deg ω(x)=deg σ(x) is judged, and if false, the procedure proceeds to step 315, outputs an error signal, and is ended, and if true, it proceeds to step 308. At step 308, the correctable judgement number h is renewed as h=h+2, and the procedure proceeds to step 309.

At step 309, since it has been found from the judgement result at steps 306 and 307 that an error exists at an extended symbol position, an extended error flag e_flag is set 1, and then, the procedure proceeds to step 311. At step 310, since it has been found from the judgement result at step 306 that there is no error at the extended symbol position, the extended error flag e_flag is set 0, and then, the procedure proceeds to step 311.

Next, at step 311, the condition of h≦p is judged, and if false, the procedure proceeds to step 315, outputs an error signal, and is ended, and if true, it proceeds to step 312. Then, processing at steps 312 to 318 is performed. At the steps 312 to 318, similar processing to the steps 211 to 217 of FIG. 8 is performed.

That is, at step 312, the error locator polynomial σ(x) is used to detect an error position. Then, at step 313, the condition of #roots=deg σ(x) is judged, and if false, the procedure proceeds to step 315, outputs an error signal, and is ended, and if true, it proceeds to step 314.

At step 314, from the error evaluator polynomial ω(x) and the error locator polynomial σ(x) obtained at step 304 and the error position i detected at step 312, an error value ei at the position i is calculated, and by using this error value ei and the 0th element $S_0$ of the syndrome S obtained at step 302, an extended error value e_ is calculated, and further, presumed information Ip=($Cp_-$, $Cp_0$, $Cp_1$, . . . , $Cp_{k-1}$) is obtained from the received word R, the error position i, the error value ei, and the extended error value e_.

Next, at step 316, the condition of e_flag=0 is judged, and if false, the procedure proceeds to step 317, and if true, it proceeds to step 318. At step 317, the condition of e_≠0 is judged, and if false, the procedure proceeds to step 315, outputs an error signal, and is ended, and if true, the presumed information Ip is outputted and the procedure is ended. On the other hand, at step 318, the condition of e_=0 is judged, and if false, the procedure proceeds to step 315, outputs an error signal, and is ended, and if true, the presumed information Ip is outputted and the procedure is ended.

A decoding apparatus for performing the decoding method for the one-extended Reed-Solomon code shown in the flowchart of FIG. 14 is structured similarly to the decoding apparatus 270 shown in FIG. 13 except the operation of the error judging circuit 287. That is, in the decoding apparatus 270 shown in FIG. 13, although the error judging circuit 287 outputs the error signal ER by the judgement processing at steps 205 to 208, in the decoding apparatus for performing the decoding method for the one-extended Reed-Solomon code shown in the flowchart of FIG. 14, the error judging circuit 287 is structured to output the error signal ER by the judgement processing at steps 306, 307 and 311.

As described above, also in the second embodiment, similarly to the first embodiment, the mixed correction at one path for the one-extended Reed-Solomon code becomes possible.

Next, a third embodiment will be described. This third embodiment also relates to a decoding method of a mixed correction which performs a normal correction and an erasure correction at the same time for the one-extended Reed-Solomon code.

Figure 15:
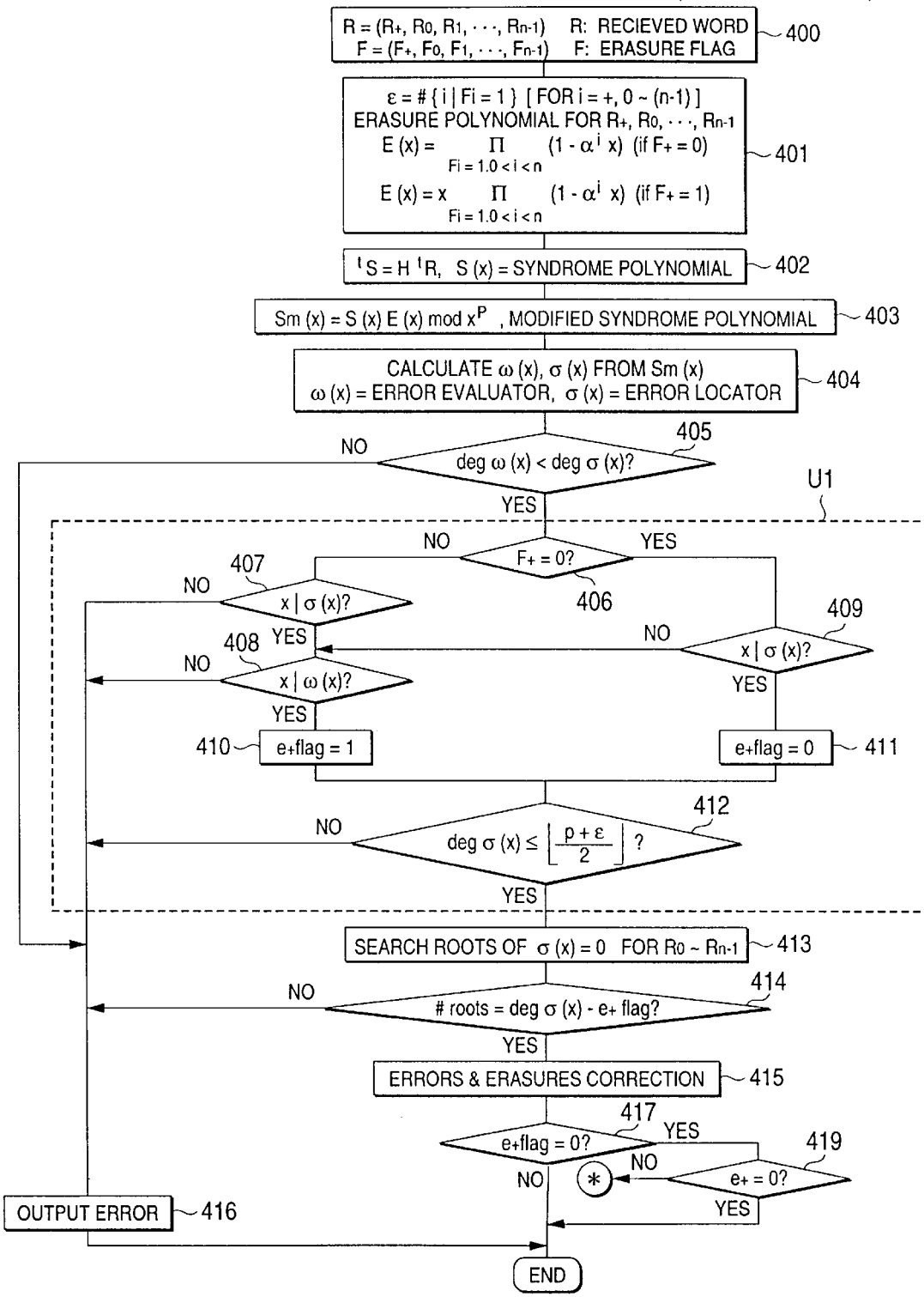
FIG. 15 is a flowchart of decoding of the one-extended Reed-Solomon code according to a third embodiment.

FIG. 15 shows a flowchart of decoding of the one-extended Reed-Solomon code in the third embodiment.

First, at step 400, a received word R=($R_+$, $R_0$, $R_1$, . . . , $R_{n-1}$) and an erasure flag F=($F_+$, $F_0$, $F_1$, . . . , $F_{n-1}$) are given. The erasure flag F is a flag in which 1 is set for a position in the received word R where it is predicted that there is an error, and 0 is set for other positions where it is predicted that there is no error. The difference from the foregoing conventional decoding method of the Reed-Solomon code is that the extended received symbol $R_+$ and the extended erasure flag $F_+$ are added. Here, the extended received symbol $R_+$ is obtained by multiplying values of symbols other than the extended received symbol by coefficients determined in relation to the symbol position and by adding the respective multiplication results. That is, $R_+ = R_0 + R_1\alpha^{p-1} + R_2\alpha^{2(p-1)} + \ldots + R_{n-1}\alpha^{(n-1)\{p-1\}}$.

Next, at step 401, the number ε of erasures is obtained through equation (22), and an erasure position polynomial E(x) to $R_+$, $R_0$, $R_1$, . . . , $R_{n-1}$ is obtained through equation (23). The difference from the foregoing conventional decoding method of the Reed-Solomon code is that the extended erasure flag $F_+$ is added in the calculation of the number ε of erasures, and x corresponding to $F_+$ is added to the erasure position polynomial E(x).

[Numerical Expression 18]

$$\varepsilon = \#\{i | F_i = 1\} \; [\text{for } i = +0 \sim (n-1)] \quad (22)$$

$$E(x) = \begin{cases} \prod_{F_i=1, 0 \le i < n} (1 - \alpha^i x) & (\text{if } F_+ = 0) \\ x \prod_{F_i=1, 0 \le i < n} (1 - \alpha^i x) & (\text{if } F_+ = 1) \end{cases} \quad (23)$$

Next, at step 402, using a parity check matrix H as expressed in equation (24), a syndrome S=($S_0$, $S_1$, . . . , $S_{p-1}$) is obtained from the foregoing equation (6). A calculation method of the syndrome S will be described later with reference to FIG. 16. Then a syndrome polynomial S(x) as expressed by the foregoing equation (7) is obtained.

[Numerical Expression 19]

$$\begin{pmatrix} 0 & 1 & 1 & 1 & \cdots & 1 \\ 0 & 1 & \alpha & \alpha^2 & \cdots & \alpha^{n-1} \\ & & & \cdot & & \\ & & & \cdot & & \\ & & & \cdot & & \\ -1 & 1 & \alpha^{p-1} & \alpha^{2(p-1)} & \cdots & \alpha^{(n-1)(p-1)} \end{pmatrix} \quad (24)$$

Next, at step 403, using the erasure position polynomial E(x) and the syndrome polynomial S(x), a modified syndrome polynomial Sm(x) is obtained as expressed by the foregoing equation (8).

Next, at step 404, an error evaluator polynomial ω(x) and an error locator polynomial σ(x) are obtained by using the modified syndrome polynomial Sm(x). A calculation method of the error evaluator polynomial ω(x) and the error locator polynomial σ(x) is the same as the calculation method (see FIG. 10) at step 204 of the flowchart of FIG. 8.

Next, at step 405, the condition of deg ω(x)<deg σ(x) is judged, and if false, the procedure proceeds to step 416 and outputs an error signal, and if true, it proceeds to step 406. Here, deg ω(x) is the degree of the error evaluator polynomial ω(x), and deg σ(x) is the degree of the error locator polynomial σ(x). At step 406, the condition of $F_+=0$ is judged, and if false, an erasure exists at the extended symbol position, and the procedure proceeds to step 407, and if true, an erasure does not exist at the extended symbol position, and the procedure proceeds to step 409.

At step 407, the condition of x|σ(x) is judged. This is judgement whether σ(x) can be divided by x, and the case where it can be divided (the extended symbol position is contained in the error position) becomes true, and the case where it can not be divided becomes false. If the judgement result is false, the procedure proceeds to step 416, outputs an error signal, and is ended, and if true, it proceeds to step 408. At step 409, the condition of x|σ(x) is judged, and if true, the procedure proceeds to step 408, and if false, it proceeds to step 411. At step 411, it has been found from the judgement results at step 405, 406 and 409 that there is no error at the extended symbol position, so that the extended error flag $e_+$flag is set 0, and then, the procedure proceeds to step 412.

At step 408, if correctable, x|ω(x) must always be realized when x|σ(x), so that the condition of x|ω(x) is judged, and if false, the procedure proceeds to step 416, outputs an error signal, and is ended, and if true, it proceeds to step 410. At step 410, since it has been found from the judgement results at steps 405, 406, 407 and 409 that there is an error at the extended symbol position, the extended error flag $e_+$flag is set 1, and then, the procedure proceeds to step 412. At step 412, the condition of the foregoing equation (9) is judged, and if false, the procedure proceeds to step 416, outputs an error signal, and is ended, and if true, it proceeds to step 413.

At step 413, the error position is detected by using the error locator polynomial σ(x). A calculation method of the error position is the same as the calculation method (see, FIG. 11) at step 211 of the flowchart of FIG. 8. At this time, detection of the error position to $R_+$ is not performed. At step 414, the condition of #roots=deg σ(x)−$e_+$flag is judged, and if false, the procedure proceeds to step 416, outputs an error signal, and is ended, and if true, it proceeds to step 415. Here, #roots is the number of error positions detected at step 413. The reason why the extended error flag $e_+$flag is subtracted from the degree of the error locator polynomial deg σ(x) is that σ(x) includes the error position corresponding to the extended symbol.

At step 415, from the error evaluator polynomial ω(x) and the error locator polynomial σ(x) obtained at step 404 and the error position i detected at step 413, an error value ei at the position i is calculated. Further, an extended error value $e_+$ is calculated by using this error value ei and the (p−1)th element $S_{p-1}$ of the syndrome S obtained at step 402. And further, presumed information Ip=($Cp_+$, $Cp_0$, $Cp_1$, . . . , $Cp_{k-1}$) is obtained from the received word R, the error position i, the error value ei, and the extended error value $e_+$. A calculation method of the presumed information Ip will be described later with reference to FIG. 17.

Next, at step 417, the condition of $e_+$flag=0 is judged, and if true, it proceeds to step 419. On the other hand, at step 419, the condition of $e_+$=0 is judged, and if false, the procedure proceeds to step 416, outputs an error signal, and is ended, and if true, the presumed information Ip is outputted and the procedure isended.

Figure 16:
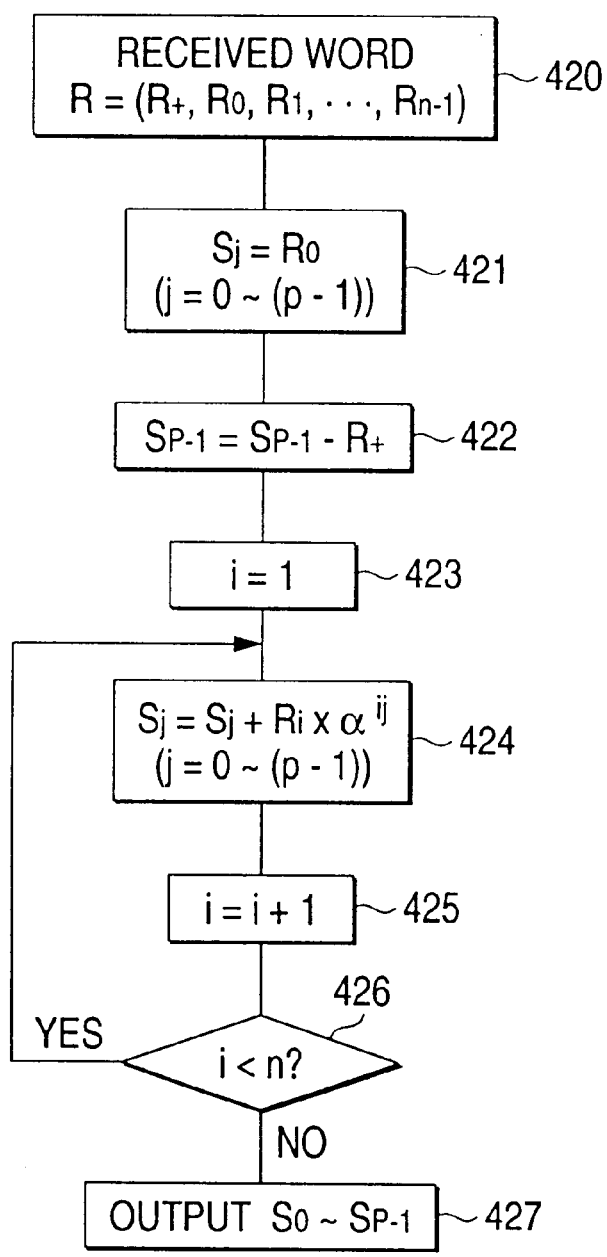
FIG. 16 is a flowchart of syndrome calculation of the one-extended Reed-Solomon code.

A method of calculating the syndrome S from the received word R will be described with reference to the flowchart of FIG. 16.

First, at step 420, the received word R=($R_+$, $R_0$, $R_1$, . . . , $R_{n-1}$) is received. At step 421, the respective elements ($S_0$, $S_1$, . . . , $S_{p-1}$) of the syndrome S are initialized by the element $R_0$ of the received word R.

Next, at step 422, the first element $R_+$ of the received word R is subtracted from the (p−1)th element $S_{p-1}$ of the syndrome S, and the subtraction result is made $S_{p-1}$. At step 423, the counter i is initialized to 1. At step 424, each element of the syndrome S is renewed by the foregoing equation (10).

Next, at step 425, the value of the counter i is increased by 1. At step 426, the condition of i<n is judged, and if true, the procedure returns to step 424 and calculation of the syndrome is repeated, and if false, it proceeds to step 427, and the syndrome S=($S_0$, $S_1$, . . . , $S_{p-1}$) is outputted.

Figure 17:
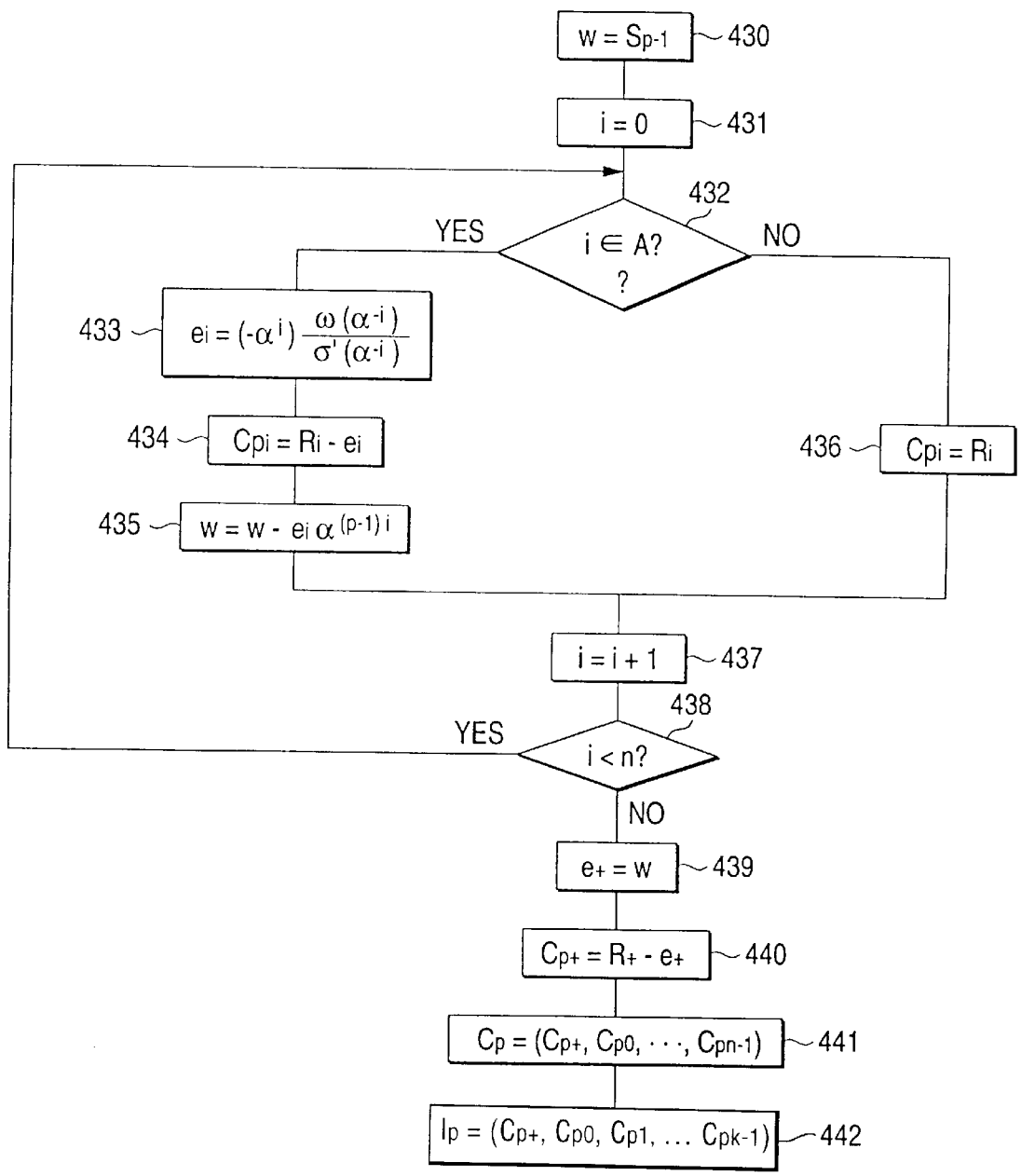
FIG. 17 is a flowchart of error correction execution of the one-extended Reed-Solomon code.

A method of correcting an error of the received word R from the error evaluator polynomial ω(x), the error locator polynomial σ(x), and the detected error position i will be described with reference to the flowchart of FIG. 17.

First, at step 430, a variable w is initialized by the (p−1)th element $S_{p-1}$ of the syndrome S. The variable w is used to calculate the extended error value $e_+$ as expressed by equation (25).

[Numerical Expression 20]

$$e_+ = S_{p-1} - \sum_{i=0}^{n-1} e_i \alpha^{(p-1)i} \quad (25)$$

Next, at step 431, the counter i is initialized to 0. At step 432, the condition of i∈A is judged, and if true, the value of the counter i indicates an error position, and the procedure proceeds to step 433, and if false, the value of the counter i is not an error position, and the procedure proceeds to step 436.

At step 433, by using the error evaluator polynomial ω(x), the differential σ'(x) of the error locator polynomial σ(x), and the error position i, the error value ei is calculated as expressed by the foregoing equation (16), and the procedure proceeds to step 434. At step 434, the i-th element Cpi of the presumed code word Cp is calculated as Ri−ei, and the procedure proceeds to step 435. At step 436, the variable w is renewed as expressed by equation (26), and the procedure proceeds to step 437. At step 436, the i-th element Cpi of the presumed code word Cp is made Ri, and the procedure proceeds to step 437.

[Numerical Expression 21]

$$w=w-e_i\alpha^{(p-1)i} \quad (26)$$

At step 437, the value of the counter i is increased by 1. At step 438, the condition of i<n (end condition) is judged, and if true, the procedure returns to step 432 and the calculation of the error value is repeated, and if false, the procedure proceeds to step 439. At step 439, the value of w is substituted for the extended error value $e_+$.

Next, at step 440, a presumed extended code symbol $Cp_+$ is set as $Cp_+=R_+-e_+$. At step 441, the presumed code word Cp=($Cp_+$, $Cp_0$, . . . , $Cp_{n-1}$) is obtained, and further, at step 442, the presumed information Ip=($Cp_+$, $Cp_0$, $Cp_1$, . . . , $Cp_{k-1}$) is obtained.

A decoding apparatus for performing the decoding method of the one-extended Reed-Solomon code shown in the flowchart of FIG. 15 is structured similarly to the decoding apparatus 270 shown in FIG. 13 except that the operations of the erasure position polynomial calculating circuit 274, (error position judging circuit 281), and the error judging circuit 287 are different.

That is, in the decoding apparatus 270 shown in FIG. 13, although the erasure position polynomial E(x) obtained in the erasure position polynomial calculating circuit 274 is not changed by the value of 1 or 0 of the extended erasure flag F (see equation (4)), in the decoding apparatus for performing the decoding method of the one-extended Reed-Solomon code shown in the flowchart of FIG. 15, the erasure position polynomial E(x) obtained by the erasure position polynomial calculating circuit 274 is changed by the value of 1 or 0 of the extended erasure flag $F_+$ (see equation (23)).

Besides, in the decoding apparatus 270 shown in FIG. 13, although the error position judging circuit 281 judges the condition of #roots=deg σ(x) and outputs the error signal ER, in the decoding apparatus for performing the decoding method of the one-extended Reed-Solomon code shown in the flowchart of FIG. 15, the error position judging circuit 281 judges the condition of #roots=deg σ(x)−$e_+$flag and outputs the error signal ER.

Besides, in the decoding apparatus 270 shown in FIG. 13, although the error judging circuit 287 outputs the error signal ER through judgement processing at steps 205 to 208, in the decoding apparatus for performing the decoding method of the one-extended Reed-Solomon code shown in the flowchart of FIG. 15, the error judging circuit 287 is structured such that the error signal ER is outputted through judgement processing at steps 405 to 409 and 412.

As described above, also in the third embodiment, similarly to the first embodiment, the mixed correction for the one-extended Reed-Solomon code at one path becomes possible. Incidentally, in the above embodiment, as a method of calculating the error evaluator polynomial ω(x) and the error locator polynomial σ(x) from the modified syndrome polynomial Sm(x), although a method (see FIG. 10) by the algorithm using the Euclidean mutual division method is used, other algorithms, for example, a method by Berlekamp-Massey Algorithm may be used.

Figure 18:
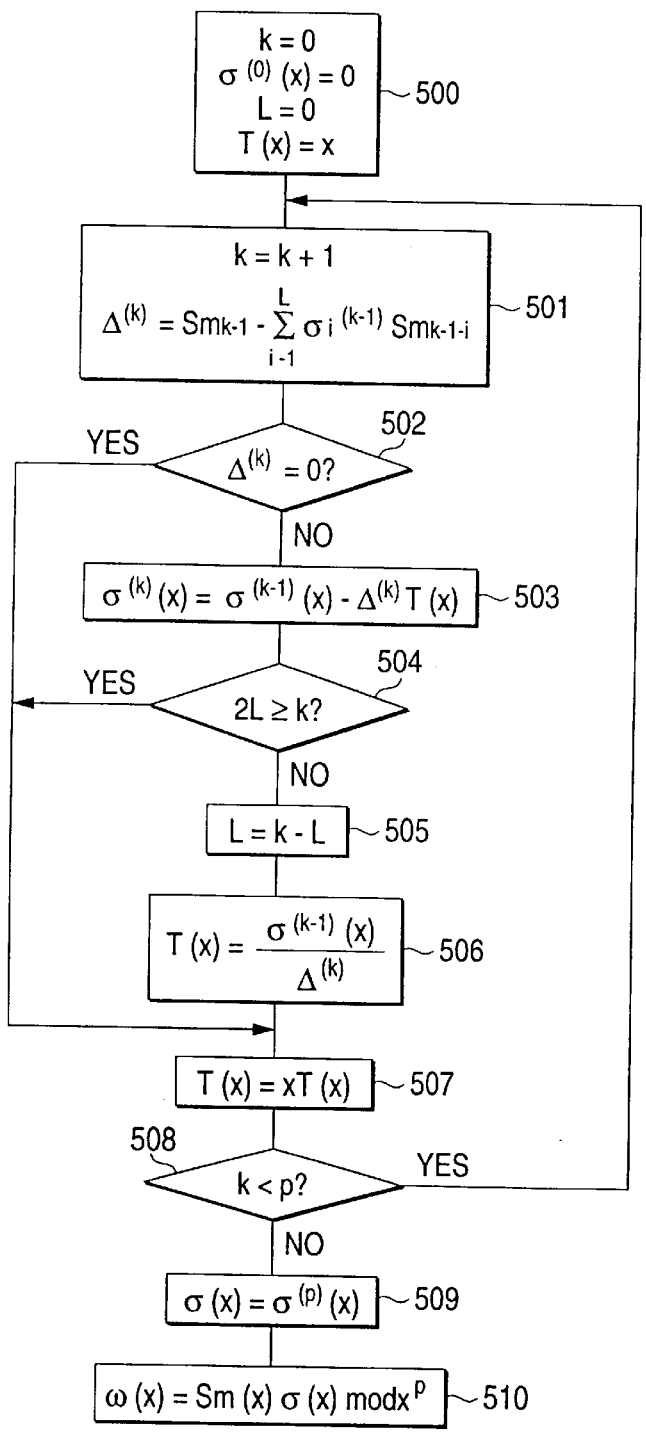
FIG. 18 is a flowchart of calculation (Berlekamp-Massey Algorithm) of an error evaluator polynomial $\omega(x)$ and an error locator polynomial $\sigma(x)$ of the one-extended Reed-Solomon code.

A method (method by the Berlekamp-Massey Algorithm) of calculating an error evaluator polynomial ω(x) and an error locator polynomial σ(x) from a modified syndrome polynomial Sm(x) will be described with reference to the flowchart of FIG. 18.

First, at step 500, k, $σ^{(0)}(x)$, L, and T(x) are initialized as k=0, $σ^{(0)}(x)$=1, L=0, and T(x)=x. At step 501, a counter k is increased by 1, and an error value $Δ^{(k)}$ is renewed as expressed by equation (27).
[Numerical Expression 22]

$$\Delta^{(k)} = Sm_{k-1} - \sum_{i=1}^{L} \sigma_i^{(k-1)} Sm_{k-1-j} \qquad (27)$$

Next, at step 502, the condition of $Δ^{(k)}$=0 is judged, and if true, the procedure proceeds to step 507, and if false, it proceeds to step 503. At step 503, $σ^{(k)}(x)$ is renewed as expressed by equation (28).
[Numerical Expression 23]

$$σ^{(k)}(x)=σ^{(k-1)}(x)-Δ^{(k)}T(x) \qquad (28)$$

Next, at step 504, the condition of 2L≦k is judged, and if true, the procedure proceeds to step 507, and if false, it proceeds to step 505. At step 505, L is renewed as L=k−L.

Next, at step 506, T(x) is renewed as expressed by equation (29), and then, the procedure proceeds to step 507. At step 507, T(x) is shifted as T(x)=xT(x).

[Numerical Expression 24]

$$T(x) = \frac{\sigma^{(k-1)}(x)}{\Delta^{(k)}} \qquad (29)$$

Next, at step 508, the condition (end condition) of k<p is judged, and if true, the procedure returns to step 501 and the calculation is repeated, and if false, it proceeds to step 509. At step 509, the error locator polynomial σ(x) is set as $σ(x)=σ^{(p)}(x)$. At step 510, the error evaluator polynomial ω(x) is obtained as expressed by equation (30).
[Numerical Expression 25]

$$ω(x)=Sm(x)σ(x) \bmod x_p \qquad (30)$$

Figure 19:
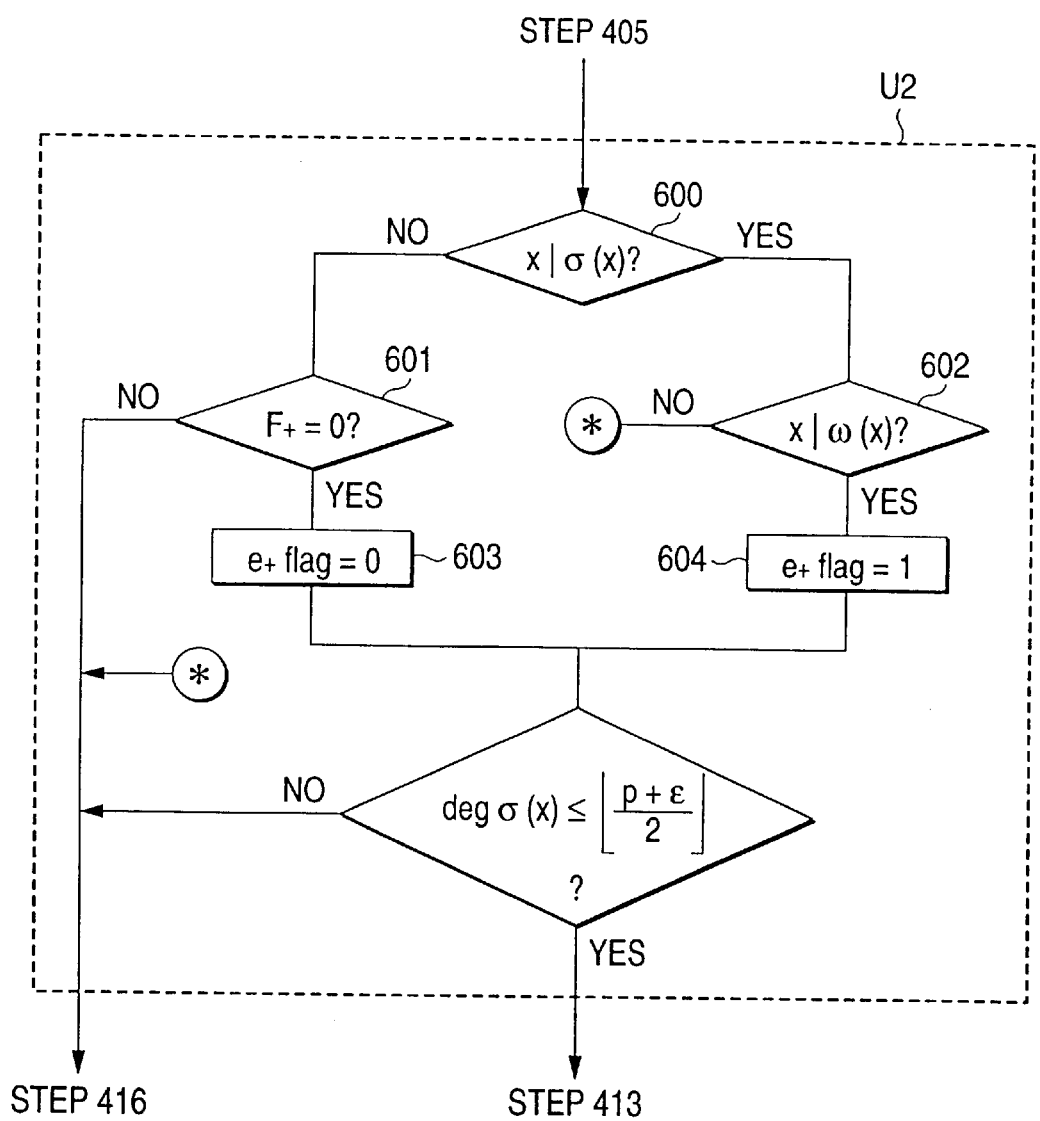
FIG. 19 is a flowchart showing another example of a correctable judgement unit.

Besides, instead of a correctable judgement unit U1 (steps 406 to 412) in the flowchart of FIG. 15 in the foregoing third embodiment, a correctable judgement unit U2 shown in FIG. 19 may be used. Similarly to the unit U1, the unit U2 also judges from σ(x), ω(x), $F_+$, p, and ε whether correction can be made.

First, at step 600, the condition of x|σ(x) is judged, and if false, the procedure proceeds step 601, and if true, it proceeds to step 602. At step 601, the condition of $F_+$=0 is judged, and if false, the procedure proceeds to step 416 and outputs an error signal, and if true, it proceeds to step 603. On the other hand, at step 602, the condition of x|ω(x) is judged, and if false, the procedure proceeds to step 416 and outputs an error signal, and if true, it proceeds to step 604.

At step 603, since it has been found from the judgement results at steps 600 and 601 that there is no error at the extended symbol position, the extended error flag $e_+$flag is set 0, and then, the procedure proceeds to step 605. At step 604, since it has been found from the judgement results at steps 600 and 602 that there is an error at the extended symbol position, $e_+$flag is set 1, and then, the procedure proceeds to step 605.

At step 605, the condition of the foregoing equation (9) is judged, and if false, the procedure proceeds to step 416 and outputs an error signal, and if true, it proceeds to 413.

Figure 10:
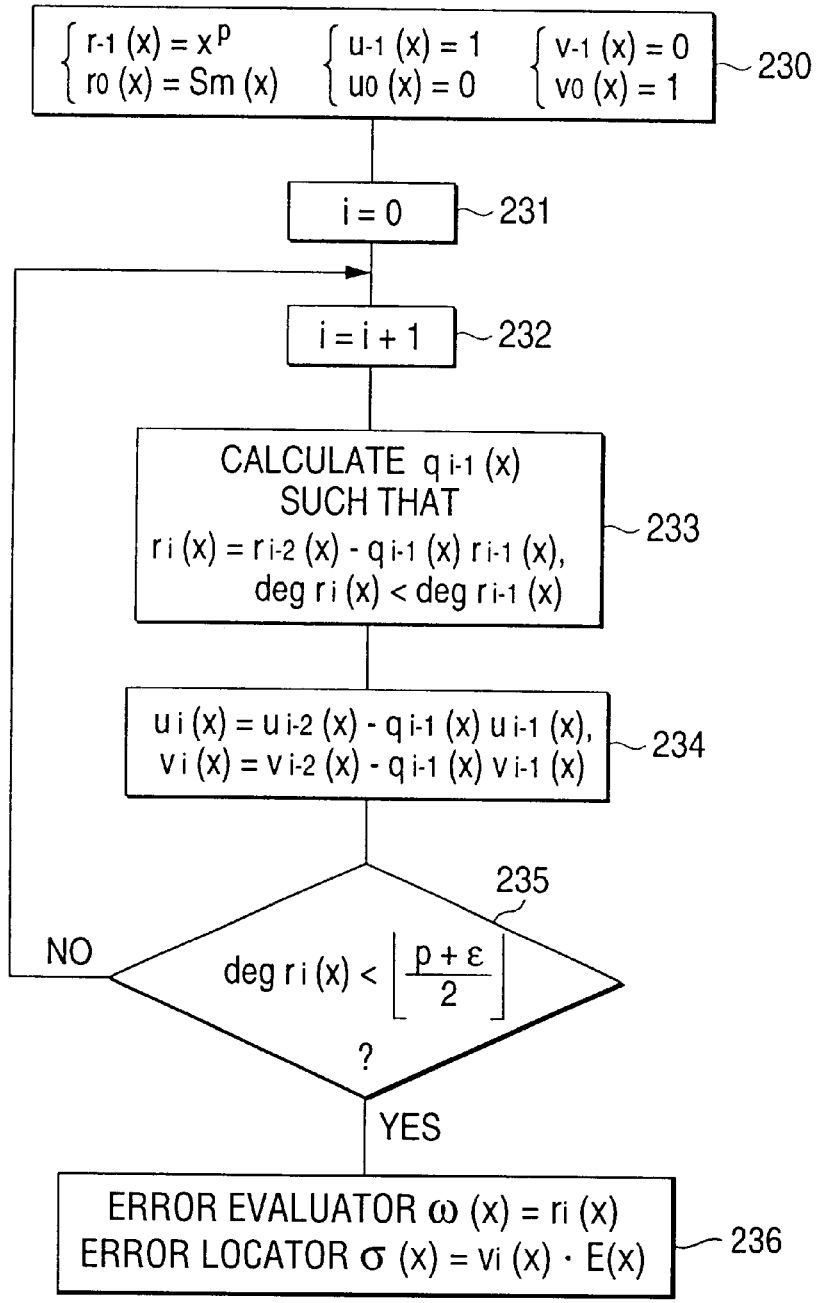
FIG. 10 is a flowchart of calculation (algorithm using the Euclidean mutual division method) of an error evaluator polynomial $\omega(x)$ and an error locator polynomial $\sigma(x)$ of the one-extended Reed-Solomon code.
Figure 20:
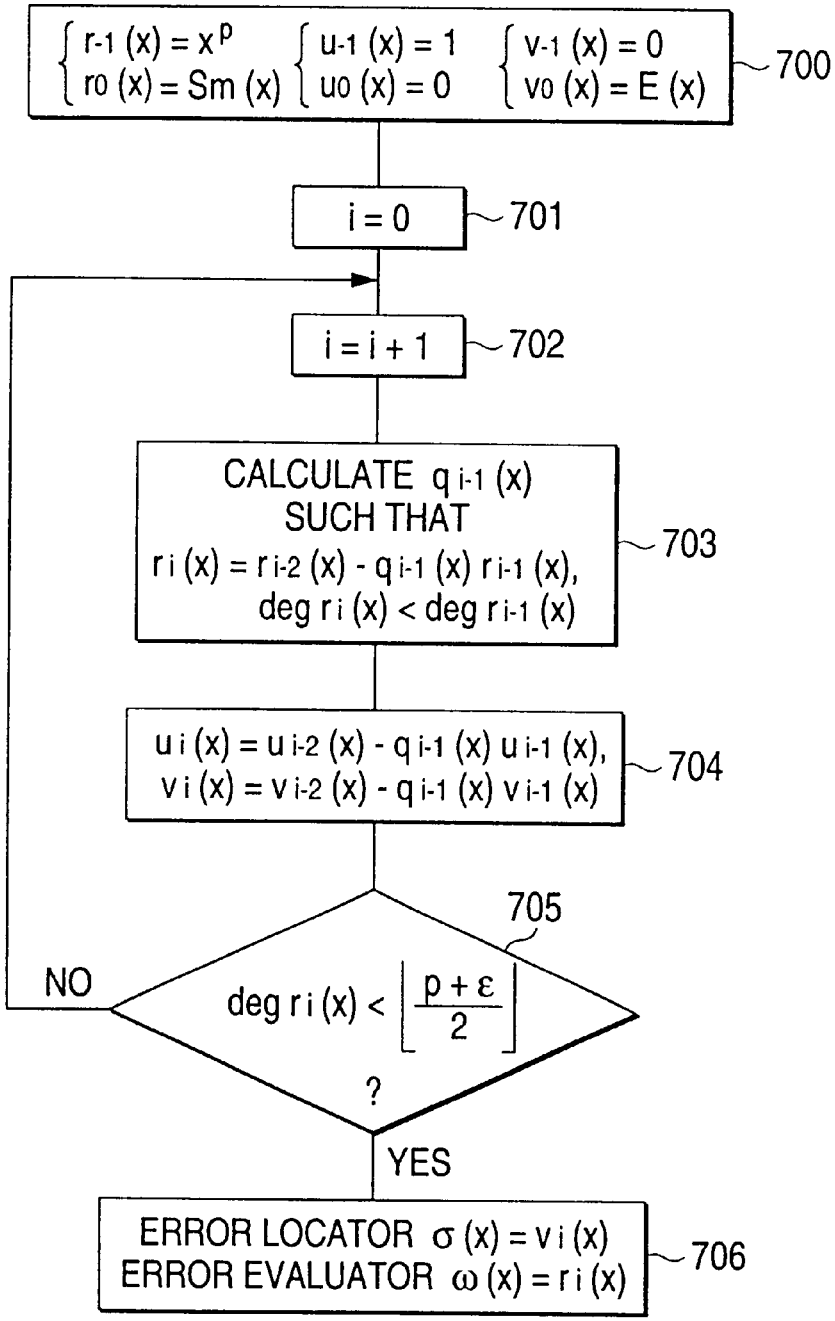
FIG. 20 is a flowchart of calculation (algorithm using the Euclidean mutual division method) of an error evaluator polynomial $\omega(x)$ and an error locator polynomial $\sigma(x)$ of the one-extended Reed-Solomon code.

In the foregoing embodiment, as a method of calculating the error evaluator polynomial ω(x) and the error locator polynomial σ(x), instead of the method shown in the flowchart of FIG. 10, a method shown in the flowchart of FIG. 20 may be used. Similarly to the method shown in the flowchart of FIG. 10, although the method shown in the flowchart of FIG. 20 is a method by algorithm using the Euclidean mutual division method, set initial values are different.

That is, at step 700, $r_{-1}(x)$, $r_0(x)$, $u_{-1}(x)$, $u_0(x)$, $v_{-1}(x)$, and $v_0(x)$ are initialized as expressed by equation (31). Although the modified syndrome polynomial Sm(x) is set for $r_0(x)$ and constant 1 is set for $v_0(x)$ respectively at step 230 of FIG. 10, the modified syndrome polynomial Sm(x) is set for $r_0(x)$ and the erasure position polynomial E(x) is set for $v_0(x)$ respectively at step 700.
[Numerical Expression 26]

$$\begin{cases} r_{-1}(x) = x^p \\ r_0(x) = Sm(x) \end{cases} \begin{cases} u_{-1}(x) = 1 \\ u_0(x) = 0 \end{cases} \begin{cases} v_{-1}(x) = 0 \\ v_0(x) = E(x) \end{cases} \qquad (31)$$

Subsequent to step 700, processing at steps 701 to 706 is performed. At steps 701 to 706, although detailed description will be omitted, processing similar to the steps 231 to 236 of FIG. 10 is performed, and the error evaluator polynomial ω(x) and the error locator polynomial σ(x) are calculated.

According to the method shown in the flowchart of FIG. 20, since the syndrome polynomial S(x) and the erasure position polynomial E(x) are used as initial values, it becomes unnecessary to obtain the modified syndrome polynomial Sm(x) (see the step 203 of FIG. 8, the step 303 of FIG. 14, and the step 403 of FIG. 15).

Figure 12:
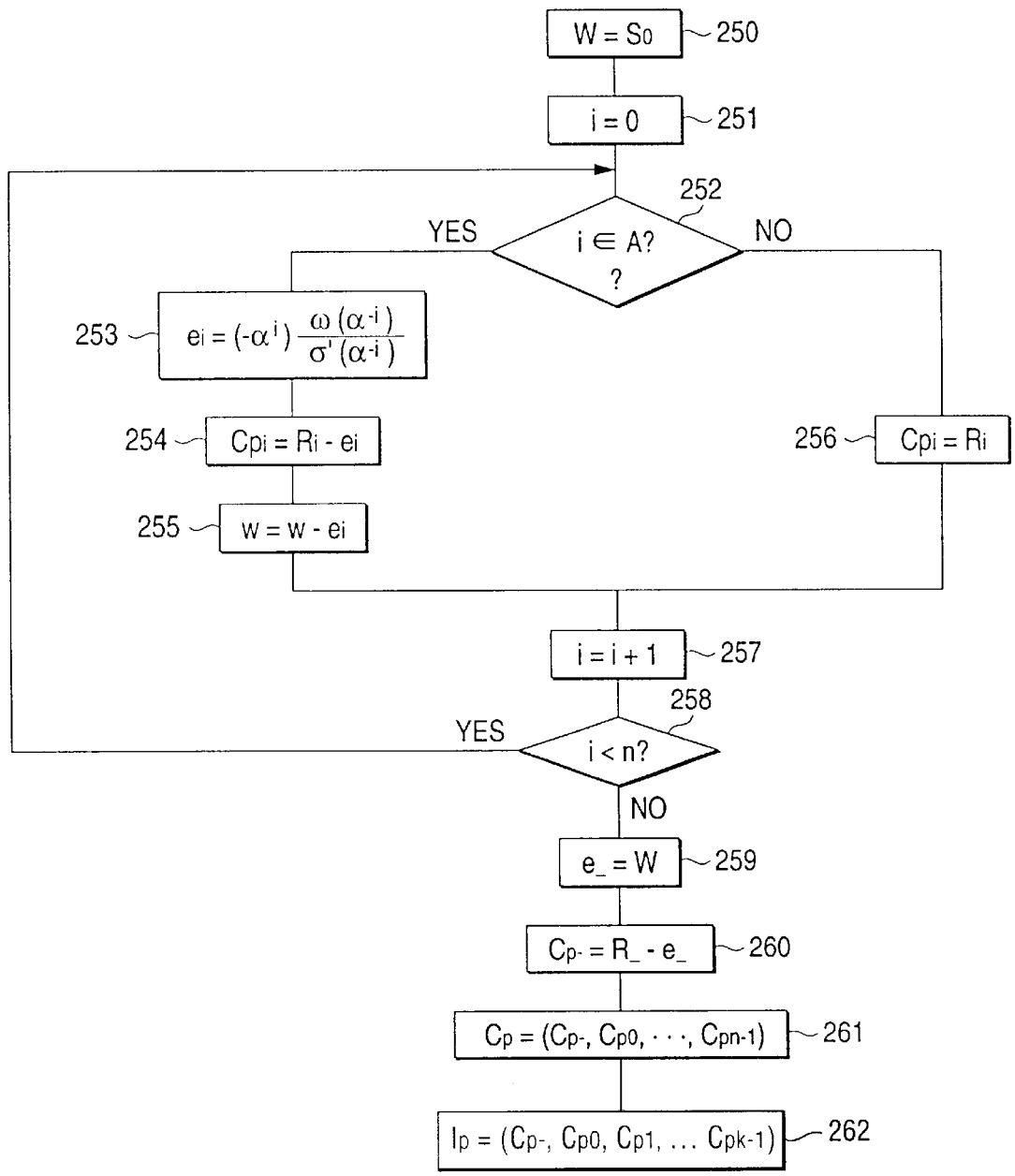
FIG. 12 is a flowchart of error correction execution of the one-extended Reed-Solomon code.

Besides, at the step 211 of FIG. 8, the step 312 of FIG. 14, and the step 413 of FIG. 15, as shown in the flowchart of FIG. 12, although the error position is detected in the ascending order, this may be performed in the descending order. Further, the detection may be performed in arbitrary order.

Besides, in the foregoing embodiments, although this invention is applied to decoding of the one-extended Reed-Solomon code, it is needless to say that this invention can also be applied to decoding of an extended BCH code (Bose-Chaudhuri-Hoequenghem code) or the like.

According to the present invention, means for performing a normal correction and an erasure correction of an extended symbol is integrated, and a mixed correction of, for example, the one-extended Reed-Solomon code at one path becomes possible. Accordingly, the invention has such effects that it becomes possible to perform the mixed correction of the one-extended Reed-Solomon code in a short time, and the scale of hardware can be made small.

What is claimed is:

1. A decoding method of an error correction code, comprising the steps of:
   (1) obtaining a syndrome polynomial from input data containing an extended symbol through calculation inclusive of the extended symbol;
   (2) obtaining an erasure position polynomial from an erasure flag corresponding to the input data;
   (3) obtaining the number of erasures from the erasure flag corresponding to the input data;
   (4) obtaining an error locator polynomial and an error evaluator polynomial from the syndrome polynomial and the erasure position polynomial;
   (5) obtaining an error position from the error locator polynomial and the error evaluator polynomial;
   (6) obtaining an error value containing the extended symbol from the error locator polynomial and the error evaluator polynomial;
   (7) obtaining output data by correcting an error of the input data by using the error position and the error value; and
   (8) performing correctable judgement inclusive of correctable judgement of the extended symbol, wherein,
      a value of the extended symbol in the input data is obtained by adding values of symbols other than the extended symbol, and
      the step of performing correctable judgment comprises comparing the number of parity symbols of the input data with a number obtained by using a degree of the error locator polynominal and the number of erasures.

2. A decoding method of an error correction code according to claim 1, wherein when it is judged at the eighth step that correction can not be made, at the seventh step, an error signal is outputted and the input data are made output data as they are.

3. A decoding method of an error correction code according to claim 1, wherein at the third step, the number of erasures is obtained from all erasure flags including an erasure flag of an extended symbol position.

4. A decoding method of an error correction code according to claim 1, wherein at the second step, the erasure position polynomial is obtained from the erasure flags except an erasure flag of an extended symbol position.

5. A decoding method of an error correction code according to claim 1, wherein the fourth step includes the steps of:
   obtaining a modified syndrome polynomial from the syndrome polynomial and the erasure position polynomial, and
   obtaining an error locator polynomial from the modified syndrome polynomial.

6. A decoding method of an error correction code according to claim 1, wherein a value of the extended symbol in the input data is obtained by multiplying a value of a symbol other than the extended symbol by a coefficient determined in relation to a symbol position and by adding each multiplication result, and
   in the seventh step it is judged whether the extended symbol position is included in the error position, and then, it is judged from the erasure flag of the extended symbol position whether there is an erasure of the extended symbol position, and then, correctable judgement is performed by comparing a degree of the error locator polynomial with a number obtained by using the number of erasures and the number of parity symbols of the input data.

7. A decoding method of an error correction code according to claim 1, wherein the sixth step includes the steps of:
   calculating error values other than the extended symbol position, and subtracting all calculated error values from a specific term of the syndrome and making a subtraction result an error value of the extended symbol position.

8. A decoding method of an error correction code according to claim 1, wherein at the fourth step, the error locator polynomial is obtained by using a Euclidean mutual division method in which an end condition is judged by comparing a value having the syndrome as an initial value with a number obtained by using the number of parity symbols of the input data and the number of erasures.

9. A decoding method of an error correction code according to claim 1, wherein at the eighth step, it is judged whether there is an error at the extended symbol position, and then, correctable judgement is made by whether an error value of the extended symbol position is 0.

10. A decoding apparatus of an error correction code, comprising:
   a means for obtaining a syndrome polynomial from input data containing an extended symbol through calculation inclusive of the extended symbol;
   a means for obtaining an erasure position polynomial from an erasure flag corresponding to the input data;
   a means for obtaining the number of erasures from the erasure flag corresponding to the received word;
   a means for obtaining an error locator polynomial and an error evaluator polynomial from the syndrome polynomial and the erasure position polynomial;
   a means for obtaining an error position from the error locator polynomial and the error evaluator polynomial;
   a means for obtaining an error value containing the extended symbol from the error locator polynomial and the error evaluator polynomial;
   an error correction means for obtaining output data by correcting an error of the input data by using the error position and the error value; and a judgement means for performing correctable judgement inclusive of correctable judgement of the extended symbol.

11. A decoding apparatus of an error correction code according to claim 10, wherein when the judgement means judges that correction can not be made, the error correction means outputs an error signal and makes output data of the input data as they are.

12. A decoding method of an error correction code, comprising the steps of:

(1) obtaining a syndrome polynomial from input data containing an extended symbol through calculation inclusive of the extended symbol;

(2) obtaining an erasure position polynomial from an erasure flag corresponding to the input data;

(3) obtaining the number of erasures from the erasure flag corresponding to the input data;

(4) obtaining an error locator polynomial and an error evaluator polynomial from the syndrome polynomial and the erasure position polynomial;

(5) obtaining an error position from the error locator polynomial and the error evaluator polynomial;

(6) obtaining an error value containing the extended symbol from the error locator polynomial and the error evaluator polynomial;

(7) obtaining output data by correcting an error of the input data by using the error position and the error value;

(8) performing correctable judgement inclusive of correctable judgement of the extended symbol;

wherein, a value of the extended symbol in the input data is obtained by multiplying a value of a symbol other than the extended symbol by a coefficient determined in relation to a symbol position and by adding each multiplication result, and at the seventh step, it is judged from an erasure flag of an extended symbol position whether there is an erasure of the extended symbol position, and then, it is judged whether the extended symbol position is included in the error position, and correctable judgement is performed by comparing a degree of the error locator polynomial with a number obtained by using the number of erasures and the number of parity symbols of the input data.

13. A decoding method of an error correction code according to claim 12, wherein at the third step, the number of erasures is obtained from all erasure flags including an erasure flag of an extended symbol position.

14. A decoding method of an error correction code according to claim 12, wherein at the second step, the erasure position polynomial is obtained from all erasure flags including an erasure flag of an extended symbol position.

15. A decoding method of an error correction code according to claim 12, wherein the sixth step includes the steps of:

calculating error values other than the extended symbol position, and multiplying all calculated error values by a coefficient determined in relation to a symbol position, subtracting all multiplication results from a specific term of the syndrome, and making a subtraction result an error value of the extended symbol position.

* * * * *